United States Patent
Kim et al.

(10) Patent No.: US 10,389,484 B2
(45) Date of Patent: Aug. 20, 2019

(54) METHOD FOR PERFORMING POLAR CODING AND APPARATUS THEREFOR

(71) Applicant: LG ELECTRONICS INC., Seoul (KR)

(72) Inventors: Bonghoe Kim, Seoul (KR); Jongwoong Shin, Seoul (KR); Seunggye Hwang, Seoul (KR); Joonkui Ahn, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/662,966

(22) Filed: Jul. 28, 2017

(65) Prior Publication Data

US 2018/0034587 A1 Feb. 1, 2018

Related U.S. Application Data

(60) Provisional application No. 62/368,197, filed on Jul. 29, 2016, provisional application No. 62/430,941, filed on Dec. 7, 2016.

(51) Int. Cl.
| | |
|---|---|
| *H04L 1/00* | (2006.01) |
| *H03M 7/40* | (2006.01) |
| *H03M 13/00* | (2006.01) |
| *H03M 13/27* | (2006.01) |
| *H03M 13/13* | (2006.01) |
| *H03M 5/12* | (2006.01) |
| *H04L 1/18* | (2006.01) |

(52) U.S. Cl.
CPC ............ *H04L 1/0058* (2013.01); *H03M 5/12* (2013.01); *H03M 7/40* (2013.01); *H03M 13/005* (2013.01); *H03M 13/13* (2013.01); *H03M 13/2792* (2013.01); *H03M 13/6362* (2013.01); *H04L 1/0057* (2013.01); *H04L 1/0071* (2013.01); *H04L 1/1861* (2013.01); *H04L 1/0067* (2013.01); *H04L 1/1819* (2013.01)

(58) Field of Classification Search
CPC ...................................................... H04L 1/057
USPC ......................................................... 714/776
See application file for complete search history.

(56) References Cited

U.S. PATENT DOCUMENTS

| | | | | |
|---|---|---|---|---|
| 9,007,241 | B2* | 4/2015 | Alhussien | H03M 13/618 341/67 |
| 2014/0208183 | A1* | 7/2014 | Mahdavifar | H03M 13/296 714/755 |
| 2015/0236715 | A1* | 8/2015 | Alhussien | H03M 7/40 341/67 |

(Continued)

*Primary Examiner* — Fritz Alphonse
(74) *Attorney, Agent, or Firm* — Lee Hong Degerman Kang & Waimey

(57) ABSTRACT

A method for performing polar encoding includes the steps of, if a length of a codeword is greater than $2^x$ and smaller than $2^{x+1}$, determining whether encoding is performed by a polar encoder of size $2^x$ or a polar encoder of size $2^{x+1}$ according to whether or not a length of the codeword is smaller than a prescribed value, and if the length of the codeword is smaller than the prescribed value, performing encoding by the polar encoder of the size $2^x$.

10 Claims, 16 Drawing Sheets

(56) References Cited

U.S. PATENT DOCUMENTS

| | | | |
|---|---|---|---|
| 2015/0333775 A1* | 11/2015 | Korb | H03M 13/45 714/780 |
| 2016/0182187 A1* | 6/2016 | Kim | H03M 13/09 714/807 |
| 2017/0364399 A1* | 12/2017 | Shi | G06F 11/073 |
| 2018/0083655 A1* | 3/2018 | El-Khamy | H04L 1/0054 |

* cited by examiner

METHOD FOR PERFORMING POLAR CODING AND APPARATUS THEREFOR

Pursuant to 35 U.S.C. § 119(e), this application claims the benefit of U.S. Provisional Patent Application Nos. 62/368,197, filed on Jul. 29, 2016 and 62/430,941, filed on Dec. 7, 2016, the contents of which are all hereby incorporated by reference herein in their entirety.

BACKGROUND OF THE INVENTION

Field of the Invention

The present invention relates to a wireless communication, and more particularly, to a method for performing polar encoding and an apparatus therefor.

Discussion of the Related Art

A next generation 5G system considers a wireless sensor network (WSN), a massive machine type communication (MTC), and the like to intermittently transmit a small packet to a massive connection/low cost/low power service.

The massive MTC service is very restrictive in a connection density requirement. On the other hand, the massive MTC service is very free in data rate and end-to-end (E2E) latency requirement (e.g., connection density: up to 200,000/km2, E2E latency: seconds to hours, DL/UL data rate: typically 1-100 kbps).

SUMMARY OF THE INVENTION

Accordingly, the present invention is directed to an apparatus and method thereof that substantially obviate one or more problems due to limitations and disadvantages of the related art.

A technical task of the present invention is to provide a method of performing polar encoding.

Another technical task of the present invention is to provide a communication device performing polar encoding.

Technical tasks obtainable from the present invention are non-limited the above-mentioned technical task. And, other unmentioned technical tasks can be clearly understood from the following description by those having ordinary skill in the technical field to which the present invention pertains.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for performing polar encoding includes the steps of, when a length of a codeword is greater than $2^x$ and smaller than $2^{x+1}$, determining whether encoding is performed by a polar encoder of size $2^x$ or a polar encoder of size $2^{x+1}$ according to whether or not a length of the codeword is smaller than a prescribed value, and if the length of the codeword is smaller than the prescribed value, performing encoding by the polar encoder of the size $2^x$. When the length of the codeword corresponds to N, the method can further include the step of generating an encoded bit sequence of size N by performing repetition on N−$2^x$ bits. If the length of the codeword is greater than the prescribed value, the method can further include the step of performing encoding by the polar encoder of the size $2^{x+1}$. When the length of the codeword corresponds to N, the method can further include the step of generating an encoded bit sequence of size N by performing puncturing on $2^{x+1}$−N bits.

The method can further include the step of performing interleaving by applying a bit-reversal pattern to the encoded bit sequence of the size N. Whether encoding is performed by a polar encoder of size $2^x$ is determined according whether a payload size of the codeword is smaller than a specific value.

To further achieve these objects and other advantages and in accordance with the purpose of the invention, as embodied and broadly described herein, a communication apparatus for performing polar encoding includes, when a length of a codeword is greater than $2^x$ and smaller than $2^{x+1}$ a processor configured to determine whether encoding is performed by a polar encoder of size $2^x$ or a polar encoder of size $2^{x+1}$ according to whether or not the length of the codeword is smaller than a prescribed value, and if the length of the codeword is smaller than the prescribed value, a polar encoder configured to perform encoding by the polar encoder of the size $2^x$.

If the length of the codeword corresponds to N, the polar encoder can be configured to generate an encoded bit sequence of size N by performing repetition on N−$2^x$ bits. If the length of the codeword is greater than the prescribed value, the polar encoder can be configured to perform encoding by the polar encoder of the size $2^{x+1}$. If the length of the codeword corresponds to N, the polar encoder can be configured to generate an encoded bit sequence of size N by performing puncturing on $2^{x+1}$−N bits.

The communication apparatus may further include an interleaver configured to perform interleaving by applying a bit-reversal pattern to the encoded bit sequence of the size N. The processor is configured to determine whether performing encoding by a polar encoder of size $2^x$ according whether a payload size of the codeword is smaller than a specific value.

According to the present invention, if polar encoding is performed according to a polar encoding scheme proposed by the present invention, it is able to considerably enhance encoding performance.

Effects obtainable from the present invention may be non-limited by the above mentioned effect. And, other unmentioned effects can be clearly understood from the following description by those having ordinary skill in the technical field to which the present invention pertains.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
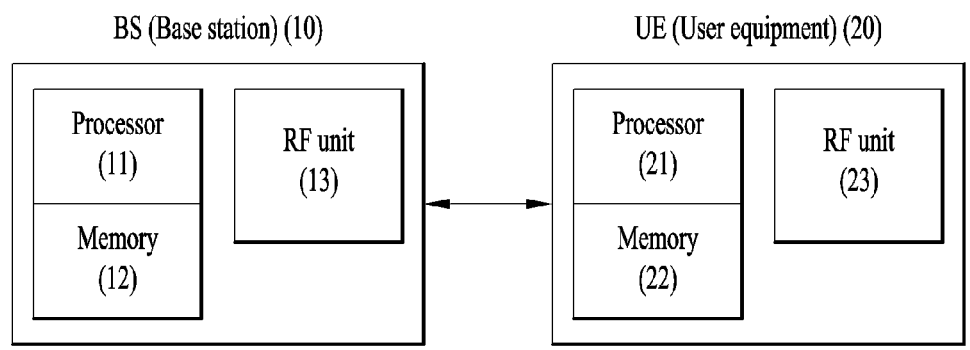
FIG. 1 illustrates system for implementing present invention.

Reference will now be made in detail to the preferred embodiments of the present invention, examples of which are illustrated in the accompanying drawings. In the following detailed description of the invention includes details to help the full understanding of the present invention. Yet, it is apparent to those skilled in the art that the present invention can be implemented without these details. For instance, although the following descriptions are made in detail on the assumption that a mobile communication system includes 3GPP LTE system, the following descriptions are applicable to other random mobile communication systems in a manner of excluding unique features of the 3GPP LTE.

Occasionally, to prevent the present invention from getting vaguer, structures and/or devices known to the public are skipped or can be represented as block diagrams centering on the core functions of the structures and/or devices. Wherever possible, the same reference numbers will be used throughout the drawings to refer to the same or like parts.

Besides, in the following description, assume that a terminal is a common name of such a mobile or fixed user stage device as a user equipment (UE), a mobile station (MS), an advanced mobile station (AMS) and the like. And, assume that a base station (BS) is a common name of such a random node of a network stage communicating with a terminal as a Node B (NB), an eNode B (eNB), an access point (AP) and the like. Although the present specification is described based on 3GPP LTE system or 3GPP LTE-A system, contents of the present invention may be applicable to various kinds of other communication systems.

In a mobile communication system, a user equipment is able to receive information in downlink and is able to transmit information in uplink as well. Information transmitted or received by the user equipment node may include various kinds of data and control information. In accordance with types and usages of the information transmitted or received by the user equipment, various physical channels may exist.

Techniques, apparatus and systems described herein can be used in various wireless access technologies such as code division multiple access (CDMA), frequency division multiple access (FDMA), time division multiple access (TDMA), orthogonal frequency division multiple access (OFDMA), single carrier frequency division multiple access (SC-FDMA), etc. The CDMA may be implemented with a radio technology such as Universal Terrestrial Radio Access (UTRA) or CDMA2000. The TDMA may be implemented with a radio technology such as Global System for Mobile communications (GSM)/General Packet Radio Service (GPRS)/Enhanced Data Rates for GSM Evolution (EDGE). The OFDMA may be implemented with a radio technology such as institute of electrical and electronics engineers (IEEE) 802.11 (Wi-Fi), IEEE 802.16 (WiMAX), IEEE 802-20, evolved-UTRA (E-UTRA) etc. The UTRA is a part of a universal mobile telecommunication system (UMTS). 3rd generation partnership project (3GPP) long term evolution (LTE) is a part of an evolved-UMTS (E-UMTS) using the E-UTRA. The 3GPP LTE employs the OFDMA in downlink and employs the SC-FDMA in uplink [1]. LTE-advanced (LTE-A) is an evolution of the 3GPP LTE. For clarity, this application focuses on the 3GPP LTE/LTE-A. However, technical features of the present invention are not limited thereto.

FIG. 1 illustrates system for implementing present invention.

In FIG. 1, a wireless communication system includes a BS 10 and one or more UE 20. In downlink, a transmitter may be a part of the BS 10, and a receiver may be a part of the UE 20. In uplink, a transmitter may be a part of the UE 20, and a receiver may be a part of the BS 10. A BS 10 may include a processor 11, a memory 12, and a radio frequency (RF) unit 13. The processor 11 may be configured to implement proposed procedures and/or methods described in this application. The memory 12 is coupled with the processor 11 and stores a variety of information to operate the processor 11. The RF unit 13 (transmitter and receiver) is coupled with the processor 11 and transmits and/or receives a radio signal. A UE 20 may include a processor 21, a memory 22, and a RF unit 23. The processor 21 may be configured to implement proposed procedures and/or methods described in this application. The memory 22 is coupled with the processor 21 and stores a variety of information to operate the processor 21. The RF unit 23 is coupled with the processor 21 and transmits and/or receives a radio signal. The BS 10 and/or the UE 20 may have single antenna and multiple antennas. When at least one of the BS 10 and the UE 20 has multiple antennas, the wireless communication system may be called as multiple input multiple output (MIMO) system.

Figure 2:
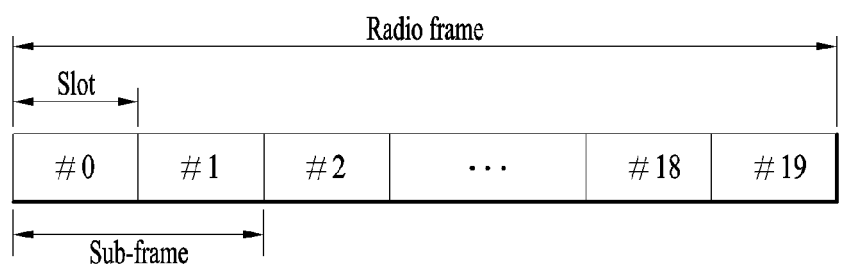
FIG. 2 illustrates structure of a radio frame of 3GPP LTE.

FIG. 2 illustrates structure of a radio frame of 3GPP LTE.

In FIG. 2, a radio frame includes 10 subframes. A subframe includes two slots in time domain. A time for transmitting one subframe is defined as a transmission time interval (TTI). For example, one subframe may have a length of 1 millisecond (ms), and one slot may have a length of 0.5 ms. One slot includes a plurality of orthogonal frequency division multiplexing (OFDM) symbols in time domain. Since the 3GPP LTE uses the OFDMA in the downlink, the OFDM symbol is for representing one symbol period. The OFDM symbol may also be referred to as an SC-FDMA symbol or a symbol period. A resource block (RB) is a resource allocation unit, and includes a plurality of contiguous subcarriers in one slot. The structure of the radio frame is shown for exemplary purposes only. Thus, the number of subframes included in the radio frame or the number of slots included in the subframe or the number of OFDM symbols included in the slot may be modified in various manners.

Figure 3:
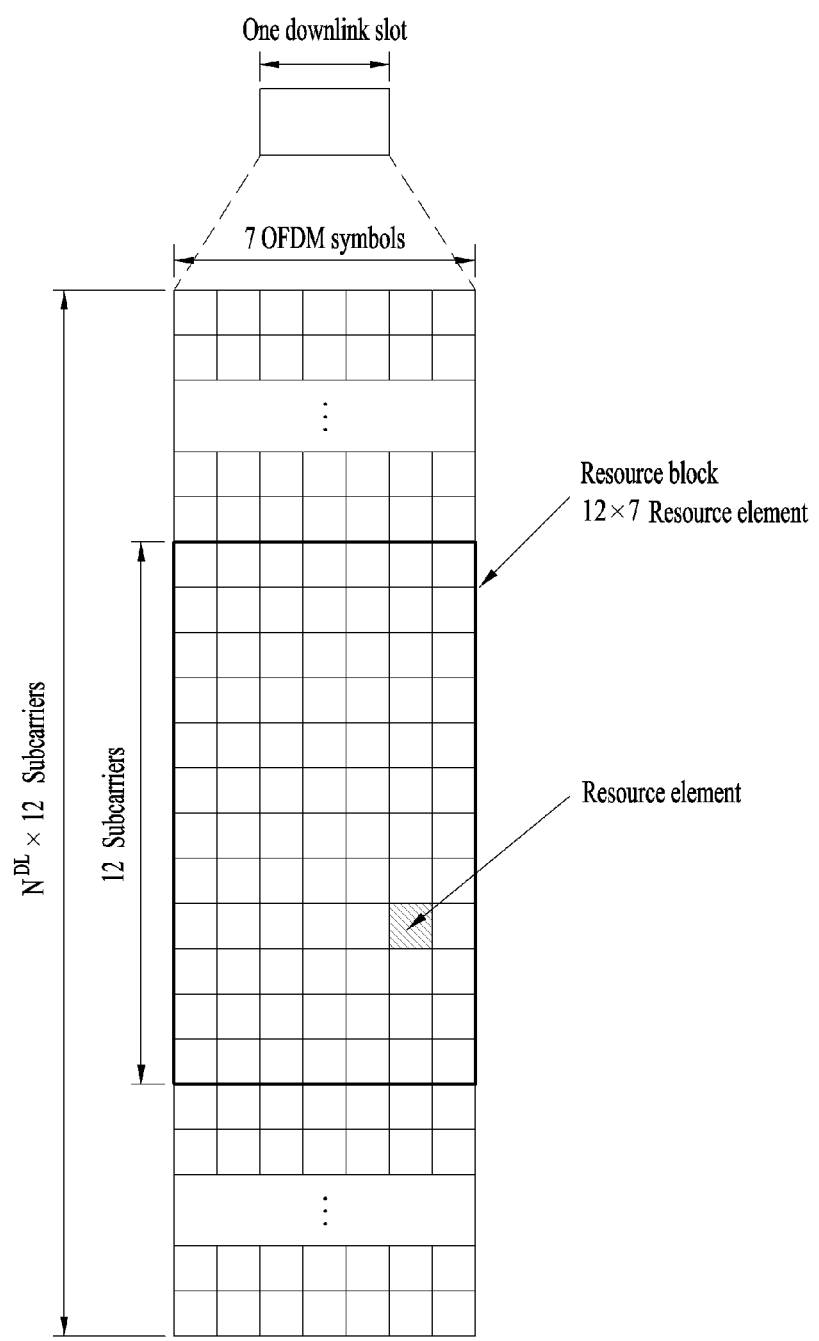
FIG. 3 illustrates resource grid for one downlink slot.

FIG. 3 illustrates resource grid for one downlink slot.

In FIG. 3, a downlink slot includes a plurality of OFDM symbols in time domain. It is described herein that one downlink slot includes 7 OFDM symbols, and one resource block (RB) includes 12 subcarriers in frequency domain as an example. However, the present invention is not limited thereto. Each element on the resource grid is referred to as a resource element (RE). One RB includes 12×7 REs. The number NDL of RBs included in the downlink slot depends on a downlink transmit bandwidth. The structure of an uplink slot may be same as that of the downlink slot.

Figure 4:
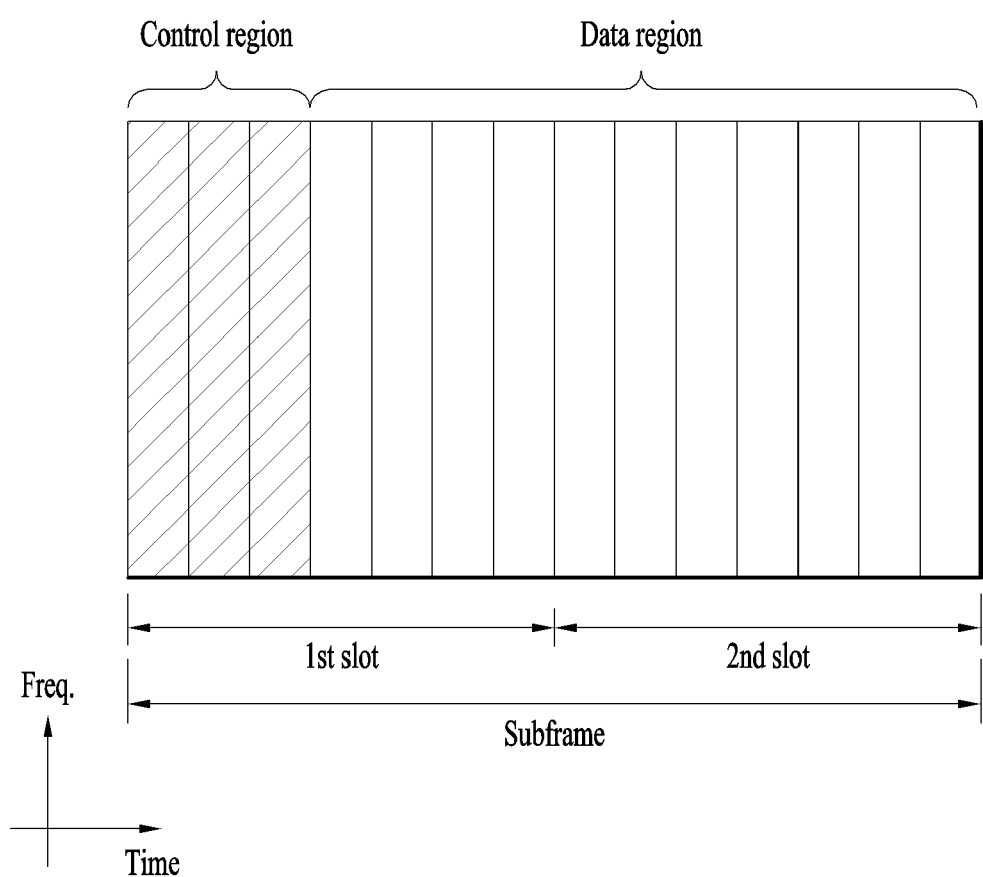
FIG. 4 illustrates structure of downlink subframe.

FIG. 4 illustrates structure of downlink subframe.

In FIG. 4, a maximum of three OFDM symbols located in a front portion of a first slot within a subframe correspond to a control region to be assigned with a control channel. The remaining OFDM symbols correspond to a data region to be assigned with a physical downlink shared chancel (PDSCH). Examples of downlink control channels used in the 3GPP LTE includes a physical control format indicator channel (PCFICH), a physical downlink control channel (PDCCH), a physical hybrid ARQ indicator channel (PHICH), etc. The PCFICH is transmitted at a first OFDM symbol of a subframe and carries information regarding the number of OFDM symbols used for transmission of control channels within the subframe. The PHICH is a response of uplink transmission and carries an HARQ acknowledgment (ACK)/not-acknowledgment (NACK) signal. Control information transmitted through the PDCCH is referred to as downlink control information (DCI). The DCI includes uplink or downlink scheduling information or includes an uplink transmit (Tx) power control command for arbitrary UE groups.

The PDCCH may carry a transport format and a resource allocation of a downlink shared channel (DL-SCH), resource allocation information of an uplink shared channel (UL-SCH), paging information on a paging channel (PCH), system information on the DL-SCH, a resource allocation of an upper-layer control message such as a random access response transmitted on the PDSCH, a set of Tx power control commands on individual UEs within an arbitrary UE group, a Tx power control command, activation of a voice over IP (VoIP), etc. A plurality of PDCCHs can be transmitted within a control region. The UE can monitor the plurality of PDCCHs. The PDCCH is transmitted on an aggregation of one or several consecutive control channel elements (CCEs). The CCE is a logical allocation unit used to provide the PDCCH with a coding rate based on a state of a radio channel. The CCE corresponds to a plurality of resource element groups (REGs). A format of the PDCCH and the number of bits of the available PDCCH are determined according to a correlation between the number of CCEs and the coding rate provided by the CCEs. The BS determines a PDCCH format according to a DCI to be transmitted to the UE, and attaches a cyclic redundancy check (CRC) to control information. The CRC is masked with a unique identifier (referred to as a radio network temporary identifier (RNTI)) according to an owner or usage of the PDCCH. If the PDCCH is for a specific UE, a unique identifier (e.g., cell-RNTI (C-RNTI)) of the UE may be masked to the CRC. Alternatively, if the PDCCH is for a paging message, a paging indicator identifier (e.g., paging-RNTI (P-RNTI)) may be masked to the CRC. If the PDCCH is for system information (more specifically, a system information block (SIB) to be described below), a system information identifier and a system information RNTI (SI-RNTI) may be masked to the CRC. To indicate a random access response that is a response for transmission of a random access preamble of the UE, a random access-RNTI (RA-RNTI) may be masked to the CRC.

Figure 5:
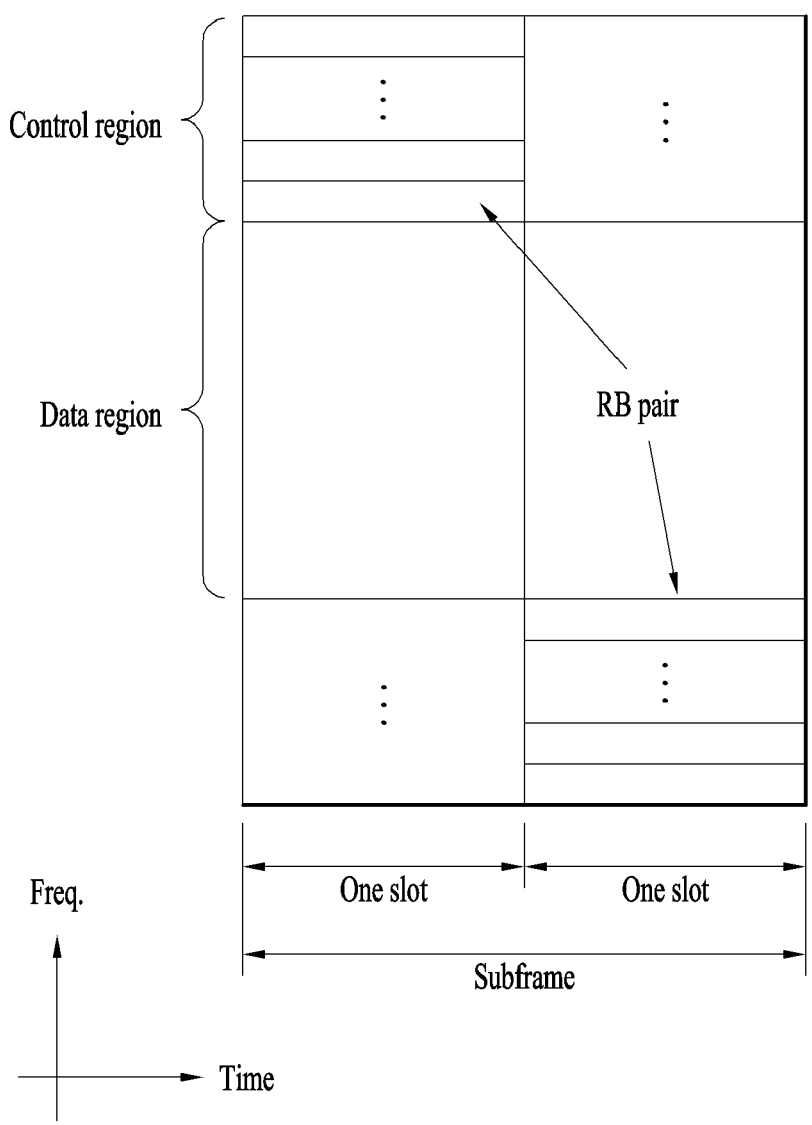
FIG. 5 illustrates structure of uplink subframe.

FIG. 5 illustrates structure of uplink subframe.

In FIG. 5, an uplink subframe can be divided in a frequency domain into a control region and a data region. The control region is allocated with a physical uplink control channel (PUCCH) for carrying uplink control information. The data region is allocated with a physical uplink shared channel (PUSCH) for carrying user data. To maintain a single carrier property, one UE does not simultaneously transmit the PUCCH and the PUSCH. The PUCCH for one UE is allocated to an RB pair in a subframe. RBs belonging to the RB pair occupy different subcarriers in respective two slots. This is called that the RB pair allocated to the PUCCH is frequency-hopped in a slot boundary.

Component Carrier Aggregation in LTE-A

Figure 6:
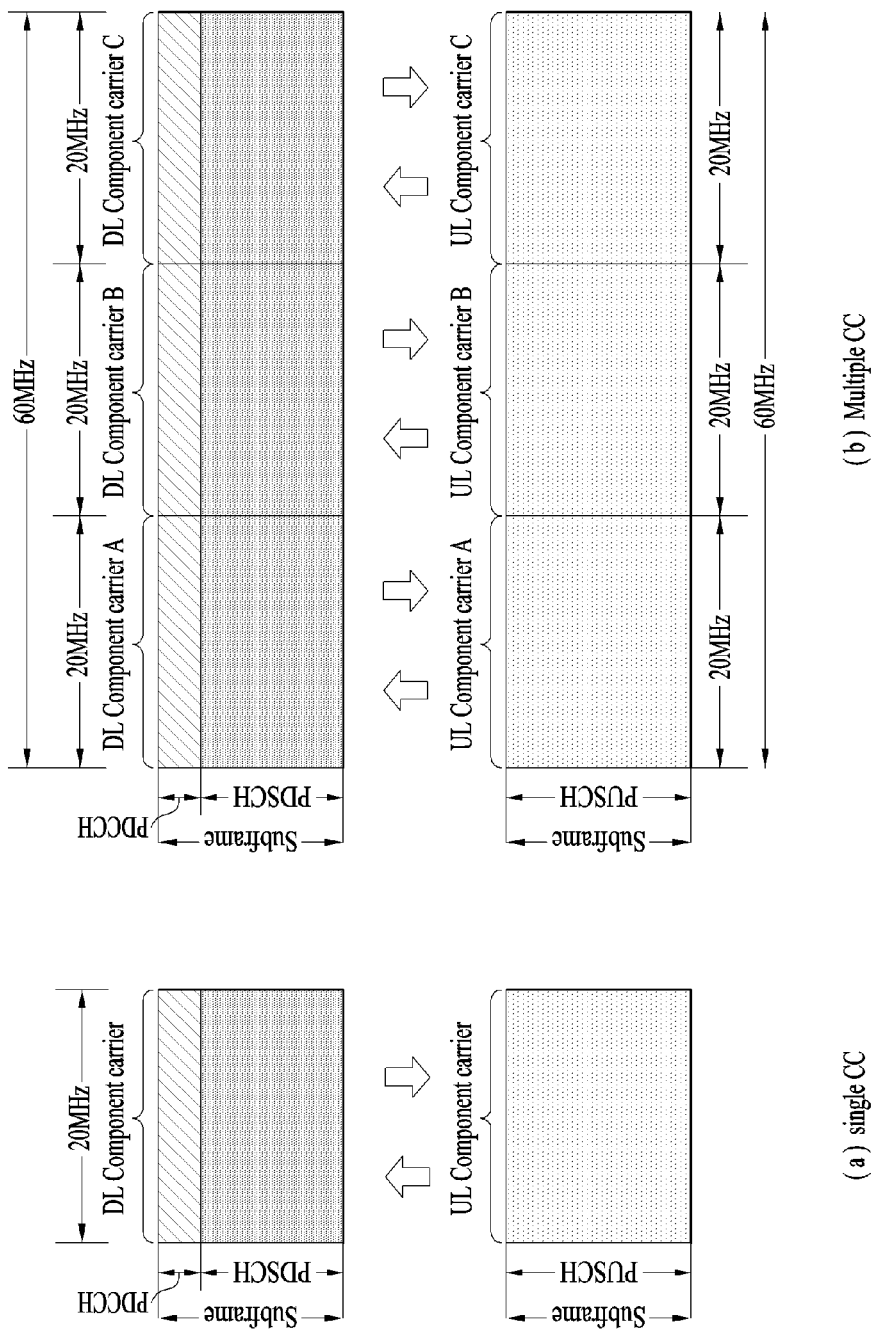
FIG. 6 illustrates subframe structure of 3GPP LTE Release-8 system and LTE-A system with CC aggregation.

FIG. 6 illustrates subframe structure of 3GPP LTE Release-8 system and LTE-A system with CC aggregation.

As the increased demands for the high data rate transmission, the mobile communication system composed of aggregated multiple CCs (component carriers) is now being researched. For example, FIG. 6 (b) illustrates the DL/UL subframe structure considered in 3GPP LTE-A (LTE Advanced) system where multiple CCs are aggregated (in this example, 3 carriers exist), while FIG. 6 (a) illustrates a single carrier operation as in conventional systems. As shown in FIG. 6 (b), a UE can monitor and receive DL signal/data from multiple DL CCs at the same time. However, even if a cell is managing N DL CCs, the network may configure a UE with M DL CCs where M☐N so that the UE's monitoring of the DL signal/data is limited to those M DL CCs. In addition, the network may configure L DL CCs as the main DL CCs from which the UE should monitor/receive DL signal/data with a priority, either UE-specifically or cell-specifically, where L≤M≤N.

Control Signaling on PUCCH

The control signaling information carried on the PUCCH can consist of:

Scheduling Request (SR)

HARQ ACK/NACK in response to downlink data packets on PDSCH. One ACK/NACK bit is transmitted in case of single codeword downlink transmission while two ACK/NACK bits are used in case of two codeword downlink transmission.

CQI (Channel Quality Indicator), which for the purposes of control signaling categorization, is taken to include the MIMO-related feedback consisting of RIs (Rank Indicators) and PMI (Precoding Matrix Indicator). 20 bits per subframe are used for the CQI.

The amount of control information which a UE can transmit in a subframe depends on the number of SC-FDMA symbols available for transmission of control signaling data (i.e. excluding SC-FDMA symbols used for reference signal transmission for coherent detection of the PUCCH). The PUCCH supports seven different formats depending on the information to be signaled. The mapping between the PUCCH format and the Uplink Control Information (UCI) supported in LTE is shown in Table 1.

TABLE 1

Supported uplink control information formats on PUCCH

| PUCCH Format | Uplink Control Information (UCI) |
| --- | --- |
| Format 1 | Scheduling request (SR) (unmodulated waveform) |
| Format 1a | 1-bit HARQ ACK/NACK with/without SR |
| Format 1b | 2-bit HARQ ACK/NACK with/without SR |
| Format 2 | CQI (20 coded bits) |
| Format 2 | CQI and 1- or 2-bit HARQ ACK/NACK (20 bits) for extended CP only |
| Format 2a | CQI and 1-bit HARQ ACK/NACK (20 + 1 coded bits) |
| Format 2b | CQI and 2-bit HARQ ACK/NACK (20 + 2 coded bits) |

Figure 7:
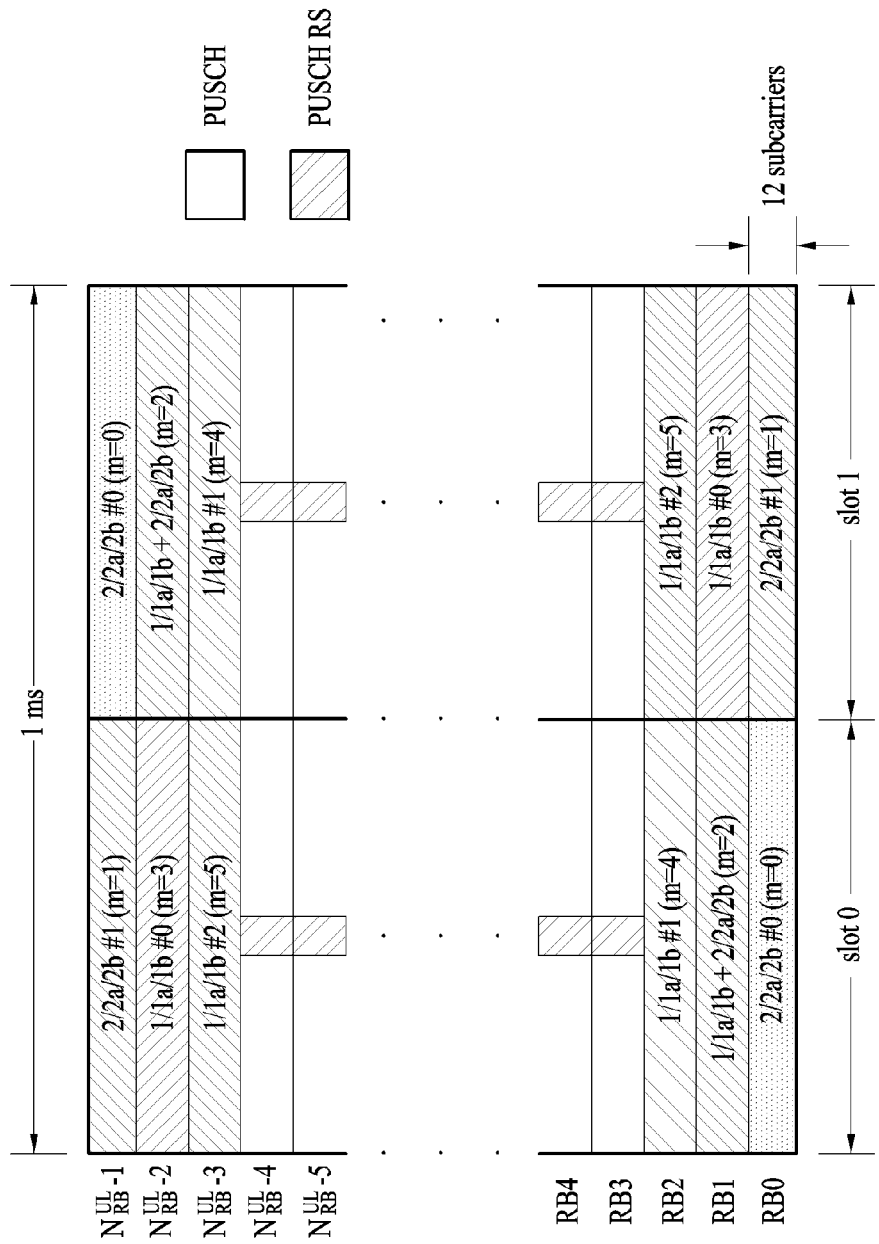
FIG. 7 illustrates physical mapping of PUCCH formats to PUCCH RBs or regions.

The physical mapping of the PUCCH formats to the PUCCH regions is shown in FIG. 7. It can be seen that PUCCH CQI formats 2/2a/2b are mapped and transmitted on the band-edge RBs (e.g. PUCCH region m=0, 1) followed by a mixed PUCCH RB (if present, e.g. region m=2) of CQI format 2/2a/2b and SR/HARQ ACK/NACK format 1/1a/1b, and then by PUCCH SR/HARQ ACK/NACK format 1/1a/1b (e.g. m=4, 5). The number of PUCCH RBs available for use by CQI format 2/2a/2b, $N_{RB}^{(2)}$, is indicated to the UEs in the cell by broadcast signaling.

FIG. 7 illustrates physical mapping of PUCCH formats to PUCCH RBs or regions.

(1). CQI Transmission on PUCCH Format 2

Figure 8:
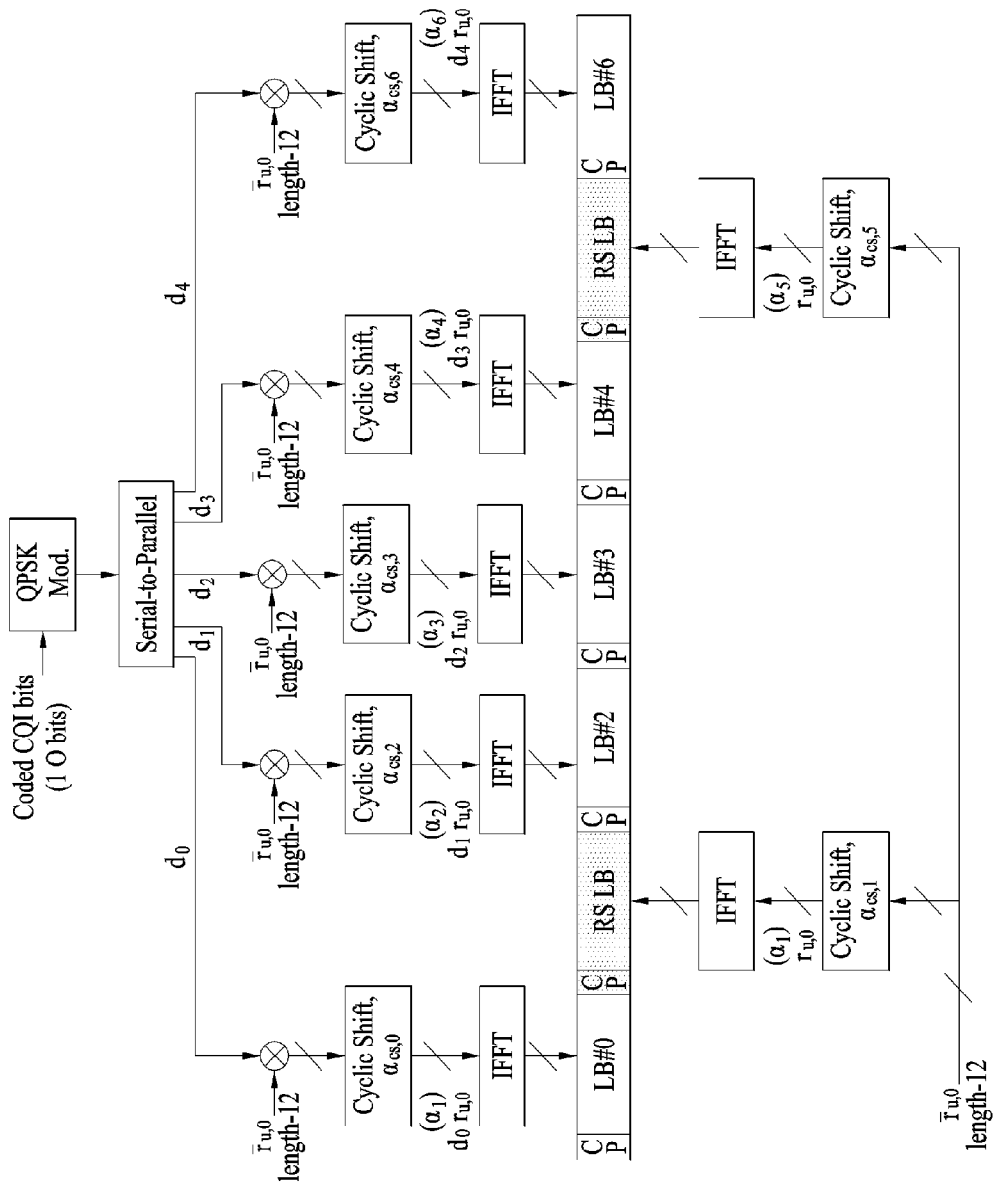
FIG. 8 illustrates CQI channel structure for PUCCH format 2/2a/2b with normal CP for one slot.

The periodicity and frequency resolution to be used by a UE to report CQI are both controlled by the eNB. In the time domain, both periodic and aperiodic CQI reporting are supported. The PUCCH (Format 2) is used for periodic CQI reporting only; the PUSCH is used for aperiodic reporting of the CQI, whereby the eNB specifically instructs the UE to send an individual CQI report embedded into a resource which is scheduled for uplink data transmission. The PUCCH CQI channel structure for one slot with normal CP is shown in FIG. 8. SC-FDMA symbols 1 and 5 are used for DM RS (Demodulation Reference Signal) transmissions in the case of the normal CP (while in the case of the extended CP only one RS is transmitted, on SC-FDMA symbol 3).

10 CQI information bits are channel coded with a rate 1/2 punctured (20, k) Reed-Muller code to give 20 coded bits, which are then scrambled (in a similar way to PUSCH data with a length-31 Gold sequence) prior to QPSK constellation mapping. One QPSK modulated symbol is transmitted on each of the 10 SC-FDMA symbols in the subframe by modulating a cyclic time shift of the base RS sequence of length-12 prior to OFDM modulation. The 12 equally-spaced cyclic time shifts allow 12 different UEs to be orthogonally multiplexed on the same CQI PUCCH RB. The DM RS sequence (on the $2^{nd}$ and $6^{th}$ SC-FDMA symbols for the normal CP, or the $4^{th}$ symbol for the extended CP) is similar to the frequency domain CQI signal sequence but without the CQI data modulation.

A UE is semi-statically configured by higher layer signaling to report periodically different CQI, PMI, and RI types on CQI PUCCH using a PUCCH resource index $n_{PUCCH}^{(2)}$, which indicates both the PUCCH region (used for the PUCCH format 2/2a/2b transmission) and the cyclic time shift to be used.

FIG. 8 illustrates CQI channel structure for PUCCH format 2/2a/2b with normal CP for one slot.

(2). HARQ ACK/NACK Transmission on PUCCH (Format 1a/1b)

Figure 9:
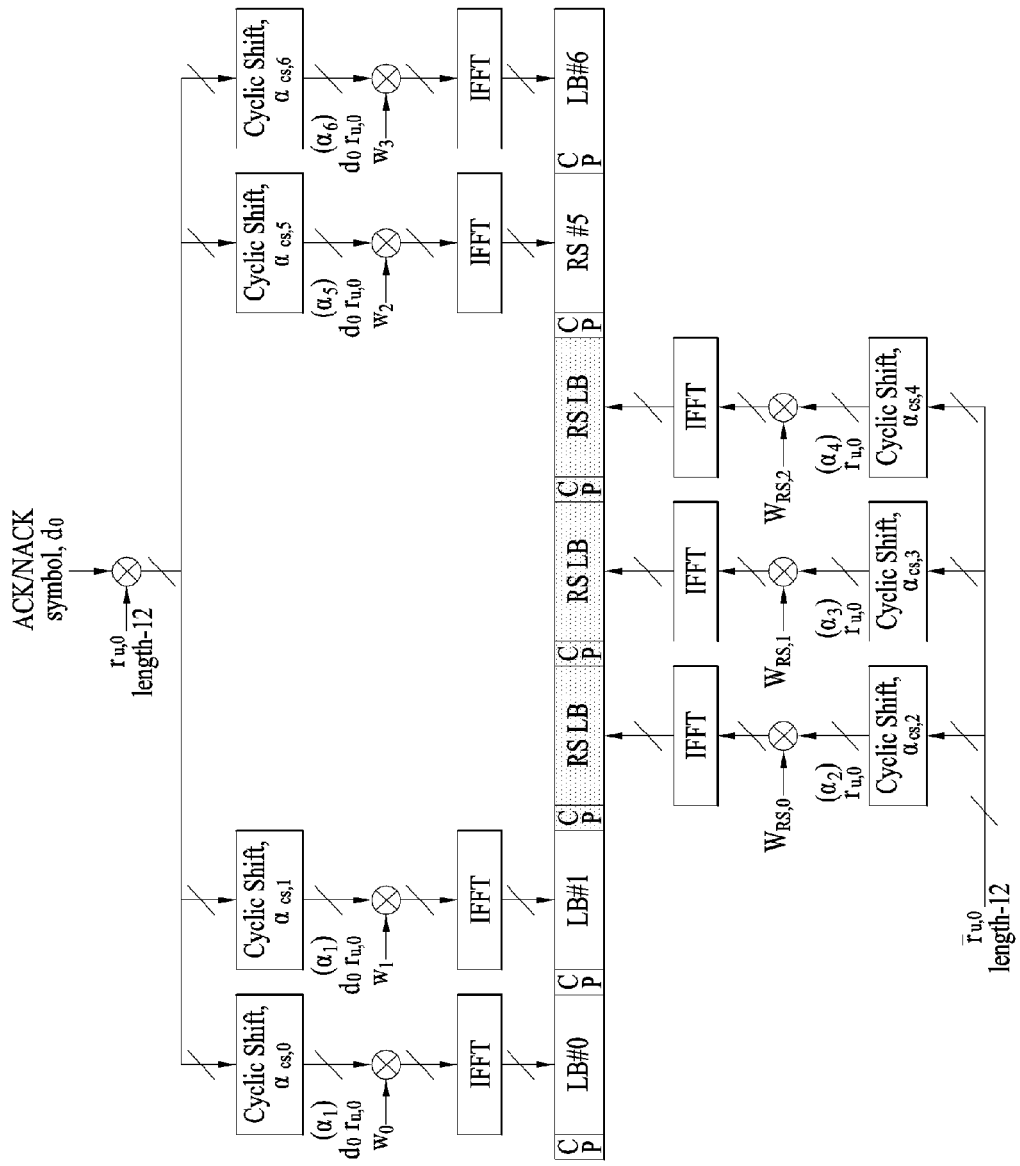
FIG. 9 illustrates ACK/NACK structure of LTE/LTE-A system.

The PUCCH channel structure for HARQ ACK/NACK transmission with no CQI is shown in FIG. 9 for one slot with normal CP. Three (two in case of extended CP) SC-FDMA symbols are used in the middle of the slot for RS (Reference Signal) transmission. Both 1- and 2-bit ACK/NACKs are supported using BPSK and QPSK modulation respectively. The ACK/NACK bits (which are not scrambled) are BPSK/QPSK resulting in a single ACK/NACK symbol. As in the case of CQI transmission, the one BPSK/QPSK modulated symbol is transmitted on each SC-FDMA data symbol by modulating a cyclic time shift of the base RS sequence of length-12 (i.e. frequency-domain CDM) prior to OFDM modulation. In addition, time-domain spreading with orthogonal (Walsh-Hadamard of DFT) spreading codes is used to code-division-multiplex UEs, The RSs from the different UEs are multiplexed in the same way as the data SC-FDMA symbols.

FIG. 9 illustrates ACK/NACK structure of LTE/LTE-A system.

(3). Multiplexing of CQI and ACK/NACK from a UE

In LTE, the simultaneous transmission of HARQ ACK/NACK and CQI by a UE can be enabled by UE-specific higher layer signaling. In case simultaneous transmission is not enabled, and the UE needs to transmit HARQ ACK/NACK on the PUCCH in the same subframe in which a CQI report has been configured, the CQI is dropped and only HARQ ACK/NACK is transmitted using the PUCCH format 1a/1b. In subframes where the eNB scheduler allows for simultaneous transmission of CQI and HARQ ACK/NACK from a UE, the CQI and the 1- or 2-bit ACK/NACK information needs to be multiplexed in the same PUCCH RB, while maintaining the low CM (Cubic Metric) single carrier property of the signal. The method used to achieve this is different for the case of normal CP and extended CP.

Figure 10:
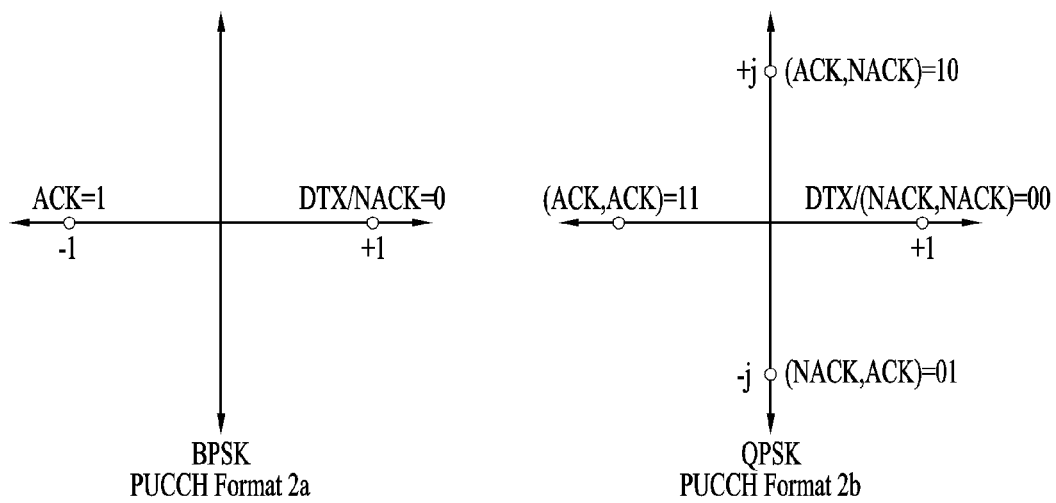
FIG. 10 illustrates constellation mapping of HARQ ACK/NACK for normal CP.

FIG. 10 illustrates constellation mapping of HARQ ACK/NACK for normal CP.

In the case of the normal CP, to transmit a 1- or 2-bit HARQ ACK/NACK together with CQI (Format 2a/2b), the ACK/NACK bits (which are not scrambled) are BPSK/QPSK modulated as shown in FIG. 10, resulting in a single HARQ ACK/NACK modulation symbol, $d_{HARQ}$. An ACK is encoded as a binary '1' and a NACK is encoded as a binary '0'. The single HARQ ACK/NACK modulation symbol, $d_{HARQ}$, is then used to modulate the second RS symbol (SC-FDMA symbol 5) in each CQI slot—i.e. ACK/NACK is signaled using the RS. It can be seen from FIG. 10 that the modulation mapping is such that a NACK (or NACK, NACK in the case of two downlink MIMO codewords) is mapped to +1, resulting in a default NACK in case neither ACK nor NACK is transmitted (so-called Discontinuous Transmission (DTX)), as happens if the UE fails to detect the downlink grant on the PDCCH. In other words, a DTX (no RS modulation) is interpreted as a NACK by the eNB, triggering a downlink retransmission.

Figure 11:
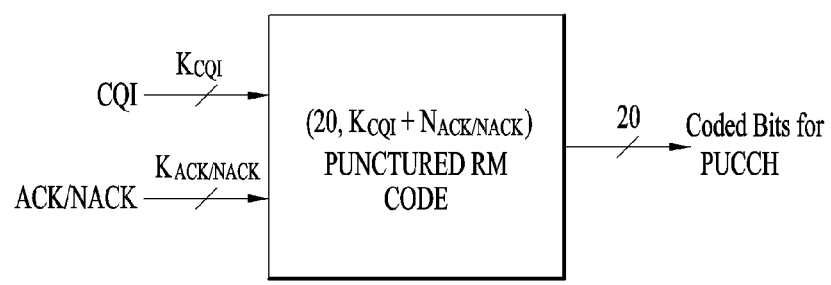
FIG. 11 illustrates joint coding of HARQ ACK/NACK and CQI for extended CP.

FIG. 11 illustrates joint coding of HARQ ACK/NACK and CQI for extended CP.

In the case of the extended CP (with one RS symbol per slot), the 1- or 2-bit HARQ ACK/NACK is jointly encoded with the CQI resulting in a (20, $k_{CQI}+k_{A/N}$) Reed-Muller based block code. A 20-bit codeword is transmitted on the PUCCH using the CQI channel structure in FIG. 8. The joint coding of the ACK/NACK and CQI is performed as shown in FIG. 11. The largest number of information bits supported by the block code is 13, corresponding to $k_{CQI}$=11 CQI bits and $k_{A/N}$=2 bits (for two codeword transmission in the downlink).

Figure 12:
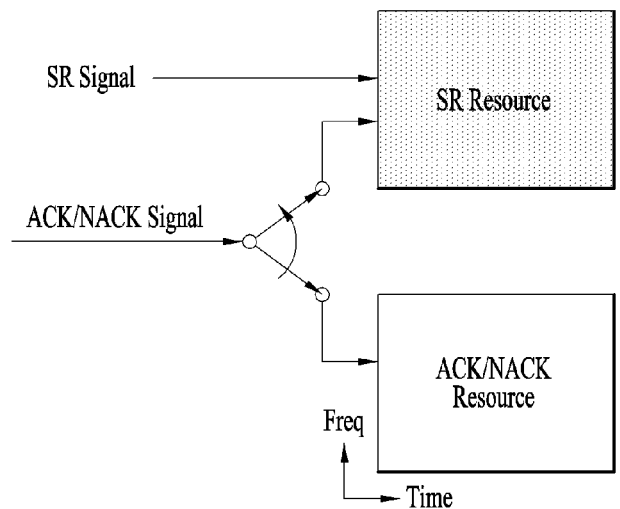
FIG. 12 illustrates multiplexing of SR and ACK/NACK.
Figure 13:
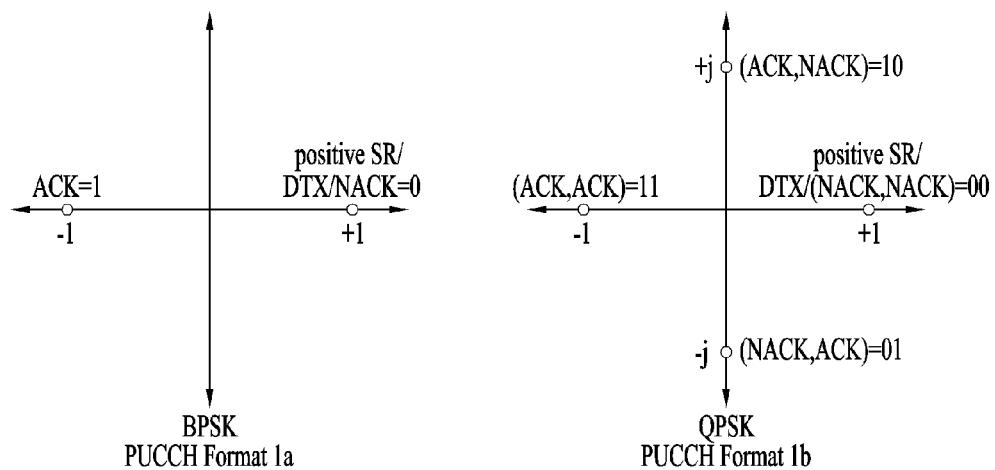
FIG. 13 illustrates constellation mapping for ACK/NACK and SR for PUCCH format 1/1a/1b.

FIG. 12 illustrates multiplexing of SR and ACK/NACK, FIG. 13 illustrates constellation mapping for ACK/NACK and SR for PUCCH format 1/1a/1b.

(4). Multiplexing of SR and ACK/NACK from a UE

If an SR signal and ACK/NACK signal happen to coincide in the same subframe, the UE transmits the ACK/NACK signal on the assigned SR PUCCH resource for a positive SR or transmits ACK/NACK on its assigned ACK/NACK PUCCH resource in case of a negative SR (see FIG. 12). The constellation mapping for simultaneous ACK/NACK and SR is shown in FIG. 13.

(5). HARQ ACK/NACK Transmission in LTE Rel-8 TDD Case

In LTE TDD (Time Division Multiplexing) case, UE can feedback HARQ ACK/NACK for multiple PDSCHs to eNB since it can receive PDSCHs during multiple subframes. There are two types of HARQ ACK/NACK transmission for LTE TDD as the followings.

ACK/NACK Bundling

With ACK/NACK bundling, ACK/NACK responses for multiple data units are combined by logical-AND operation. For example, if the RX node decodes all the data units successfully, RX node transmits ACK using one ACK/NACK unit. Otherwise, if the RX node fails in decoding (or detecting) any of the data units transmitted the RX node may either transmits NACK using one ACK/NACK unit or transmits nothing for ACK/NACK.

ACK/NACK Multiplexing

With ACK/NACK multiplexing, contents of the ACK/NACK responses for multiple data units are identified by the combination of the ACK/NACK unit used in actual ACK/NACK transmission and the one of QPSK modulation symbols (which presents contents of the transmitted ACK/NACK). For example, if we assume one ACK/NACK unit carries two bits and two data units can be transmitted in maximum (here we assume HARQ operation for each data unit can be managed by single ACK/NACK bit), the ACK/NACK result can be identified at the TX node as in the following Table 2.

TABLE 2

Example of ACK/NACK multiplexing based on single ACK/NACK unit selection

| HARQ-ACK(0), HARQ-ACK(1) | $n_{PUCCH}^{(1)}$ | b(0), b(1) |
| --- | --- | --- |
| ACK, ACK | $n_{PUCCH,1}^{(1)}$ | 1, 1 |
| ACK, NACK/DTX | $n_{PUCCH,0}^{(1)}$ | 0, 1 |
| NACK/DTX, ACK | $n_{PUCCH,1}^{(1)}$ | 0, 0 |
| NACK/DTX, NACK | $n_{PUCCH,1}^{(1)}$ | 1, 0 |
| NACK, DTX | $n_{PUCCH,0}^{(1)}$ | 1, 0 |
| DTX, DTX | N/A | N/A |

In Table 2, HARQ-ACK(i) indicates the ACK/NACK result for the data unit i (there are maximum 2 data units, that is, data unit 0 and data unit 1 in this example). In Table 2, DTX means there is no data unit transmitted for corresponding HARQ-ACK(i) or the RX node doesn't detect the existence of the data unit corresponding to HARQ-ACK(i). $n_{PUCCH,x}^{(1)}$ indicates the ACK/NACK unit which should be used in actual ACK/NACK transmission, where there are two ACK/NACK units, $n_{PUCCH,0}^{(1)}$ and $n_{PUCCH,1}^{(1)}$ in maximum. b(0), b(1) indicates two bits carried by the selected ACK/NACK unit. Modulation symbol which is transmitted through ACK/NACK unit is decided according to the bits.

For example, if the RX node receives and decodes two data units successfully, the RX node should transmit two bits, (1, 1), using ACK/NACK unit $n_{PUCCH,1}^{(1)}$. For another example, if the RX node receives two data units, fails in decoding (or misses) the first data unit (corresponding to HARQ-ACK(0)) and decodes the second data unit (corresponding to HARQ-ACK(1)) successfully, the RX node should transmit (0, 0) using $n_{PUCCH,1}^{(1)}$. By linking the actual ACK/NACK contents with the combination of ACK/NACK unit selection and the actual bit contents in the transmitted ACK/NACK unit in this way, ACK/NACK transmission using single ACK/NACK unit for multiple data units is possible. The example above can be extended to the ACK/NACK transmission for more than 2 data units in natural way.

In ACK/NACK multiplexing method, basically, NACK and DTX are coupled as NACK/DTX as shown in Table 1 if at least one ACK exists for all data units. This is because combinations of ACK/NACK unit and QPSK symbol are insufficient to cover all ACK/NACK hypotheses based on decoupling of NACK and DTX. On the other hand, for the case that no ACK exists for all data units (in other words, NACK or DTX only exists for all data units), single definite NACK case is defined as the case that only one of HARQ-ACK(i)s is NACK decoupled with DTX. In this case, ACK/NACK unit linked to the data unit corresponding to single definite NACK can be also reserved to transmit the signal of multiple ACK/NACKs.

Focusing on ACK/NACK multiplexing approach, when the maximum number of data units which can be transmitted within a given amount of physical resources becomes larger, the required ACK/NACK hypotheses for ACK/NACK multiplexing over all the data units may exponentially increase. Denoting the maximum number of data units and the number of corresponding ACK/NACK units as N and $N_A$, respectively, $2^N$ ACK/NACK hypotheses are required for ACK/NACK multiplexing even if DTX case is precluded. On the other hand, applying the single ACK/NACK unit selection as shown in above example, up to $4N_A$ ACK/NACK hypotheses are only supportable. In other words, as the number of data units increases, the single ACK/NACK unit selection requires relatively larger amount of ACK/NACK units which yields increased overhead of control channel resources required to transmit the signal for multiple ACK/NACKs. For example, if 5 data units (N=5) can be transmitted in maximum, 8 ACK/NACK units ($N_A$=8) should be available for ACK/NACK transmission because the required number of ACK/NACK hypotheses for ACK/NACK multiplexing is $2^N$=32 (=$4N_A$).

Uplink Channel Coding in LTE-Release 8 for PUCCH Format 2

In LTE uplink transmission, the certain control channels are encoded utilizing a linear block code (as shown in Table 4. If input bits to the linear block code is denoted as $a_0, a_1, a_2, \ldots, a_A$, after encoding the bits are denoted by $b_0, b_1, b_2, \ldots, b_B$ where B=20 and with $$b_i = \left(\sum_{n=0}^{A-1} (a_n \cdot M_{i,n})\right) \bmod 2, \text{ where } i = 0, 1, 2, \ldots, B-1.$$

TABLE 3

Basis sequences for (20, A) code.

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 1 | 0 | 0 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 0 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Figure 14:
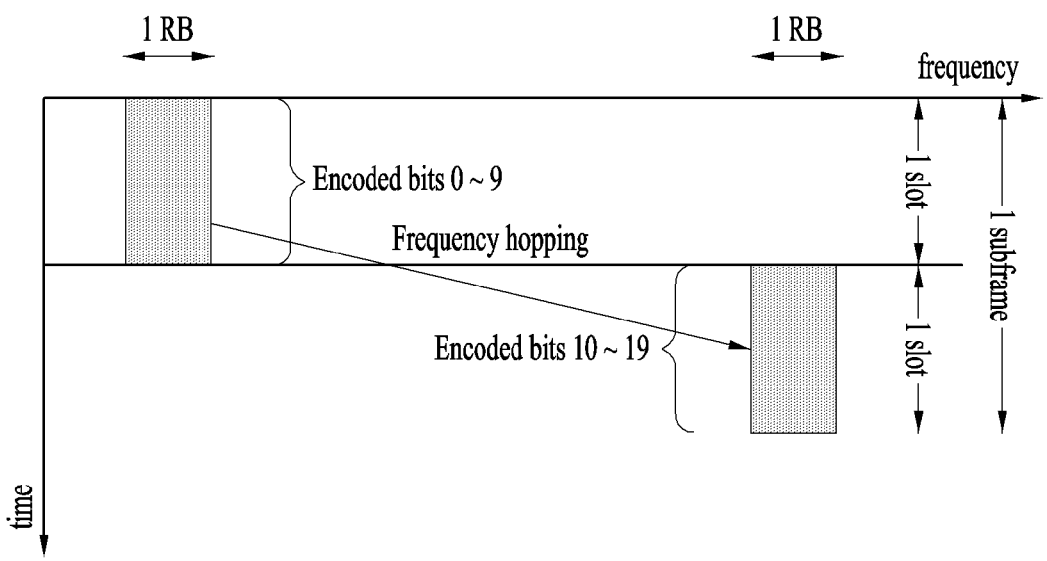
FIG. 14 illustrates mapping encoded bits to code-time-frequency resource.

FIG. 14 illustrates mapping encoded bits to code-time-frequency resource.

The encoded bits then are mapped to code-time-frequency resource as shown in FIG. 14. The first 10 encoded bits are mapped a certain code-time-frequency resource, and the last 10 encoded bits are mapped to a different code-time-frequency resource, where the frequency separation between first 10 and last 10 encoded bits are usually large. This is to achieve frequency diversity for the encoded bits.

Uplink Channel Coding in LTE-A (Release 10).

As mentioned in the foregoing description, when UCI is transmitted using a PUCCH format 2 in LTE-Rel 8, RM coding of (20, A) shown in Table 3 is performed on CSI of maximum 13 bits. On the contrary, if UCI is transmitted on PUSCH, RM coding of (32, A) shown in Table 4 is performed on CQI of maximum 11 bits. In order to match a code rate to be transmitted on PUSCH, truncation or circular repetition is performed.

TABLE 4

Basis sequences for (32, O) code

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
|---|---|---|---|---|---|---|---|---|---|---|---|
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 1 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 1 | 0 | 1 | 1 | 1 | 1 | 0 |
| 25 | 1 | 1 | 0 | 0 | 0 | 1 | 1 | 1 | 0 | 0 | 1 |
| 26 | 1 | 0 | 0 | 1 | 0 | 1 | 0 | 0 | 1 | 1 | 0 |
| 27 | 1 | 1 | 1 | 1 | 0 | 1 | 0 | 1 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 0 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

Figure 18:
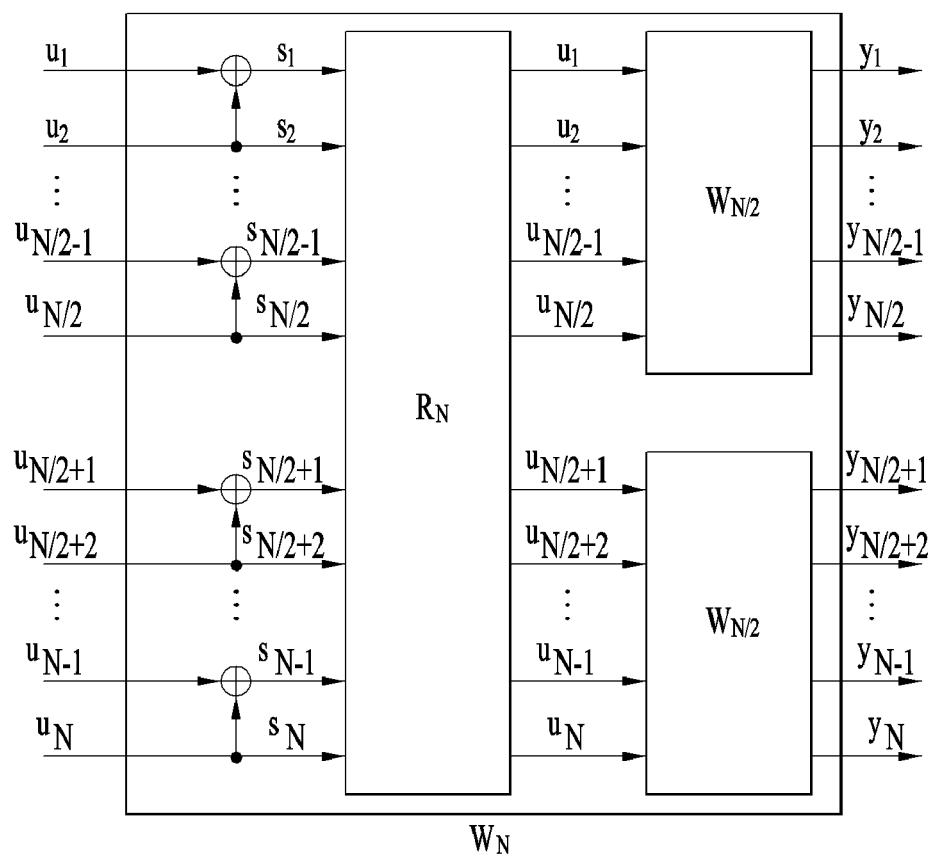
FIG. 18 illustrates an N level channel combining procedure performed by polar coding.

LTE-A system has introduced a PUCCH format 3 to transmit UCI (A/N and SR) bit of maximum 21 bits. In case of using a normal CP, a UE may be able to transmit 48 coded bits using the PUCCH format 3. In particular, if the number of UCI bits is equal to or less than 11, circular repetition is used to match the UCI bits with the number coded bits required by the PUCCH format 3 while using the (32, A) RM coding. If the number of UCI bits is greater than 11, since the number of (32, A) RM code basis sequences shown in Table 11 is insufficient, as shown in FIG. 18, two coded bits are generated using two (32, A) RM coding blocks (this is called Dual RM). In order to reduce the two coded bits in accordance with the number of PUCCH format 3 coded bits, the remaining bits are truncated and interleaving is performed.

When the UCI of maximum 21 bits is transmitted on PUSCH, if the number of UCI bits is equal to or less than 11, similar to a legacy Rel-8, truncation or circular repetition is performed to match a code rate to be transmitted on PUSCH using (32, A) RM coding. If the number of UCI bits is greater than 11, two coded bits are generated using Dual RM and truncation or circular repetition is performed to match the two coded bits with a code rate to be transmitted on PUSCH.

Figure 15:
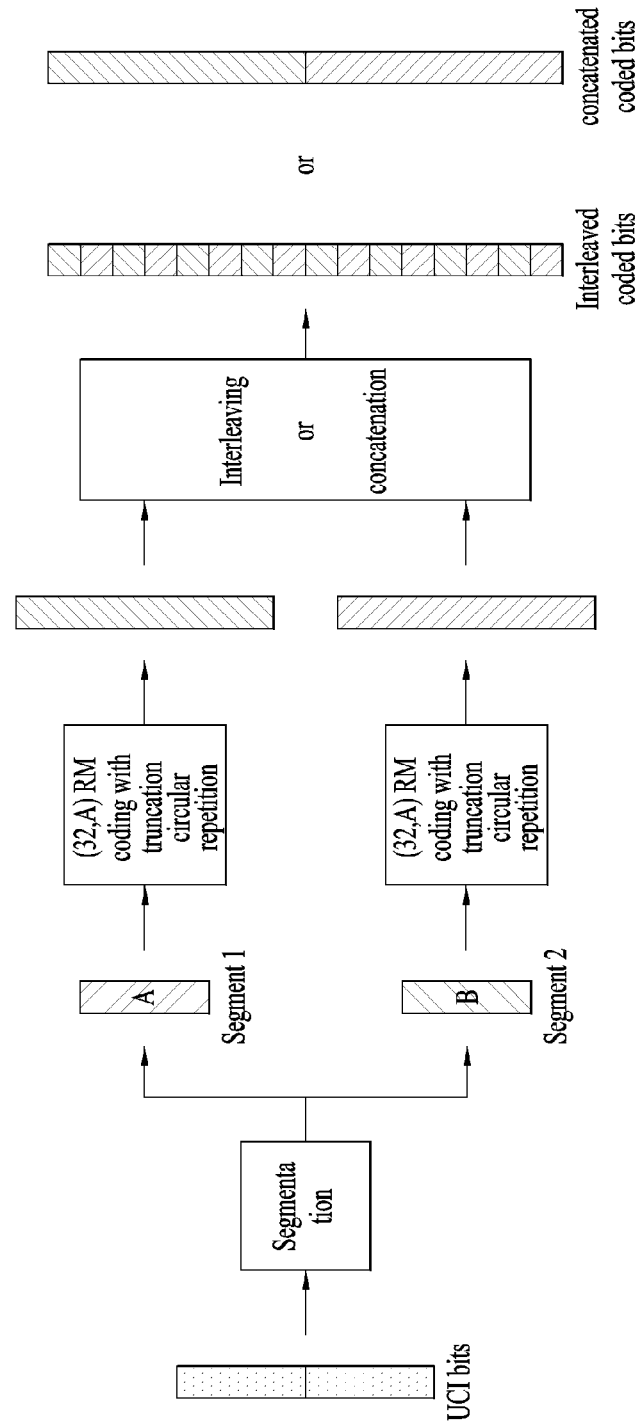
FIG. 15 illustrates Dual RM.

FIG. 15 illustrates Dual RM.

Referring to FIG. 15, if the number of inputted UCI bits corresponds to 21, a transmitting end divides the UCI bits into a part 1 and a part 2. Subsequently, (32, A) RM coding is applied to the part 1 and the part 2, respectively. The transmitting end truncates or interleaves coded bits to match the coded bit with 48 bits capable of being transmitted in the PUCCH format 3. Subsequently, the transmitting end performs interleaving or concatenation on the outputted coded bits to make the coded bits to be transmitted via the PUCCH format 3.

More specifically, an order of configuring bits according to UCI content is explained in the following. When a PUCCH format 3 is configured to be used in a subframe in which an SR is transmitted, if SR and A/N is transmitted using the PUCCH format 3 or PUSCH, the A/N is preferentially deployed and then the SR is deployed to configure UCI bit.

Figure 16:
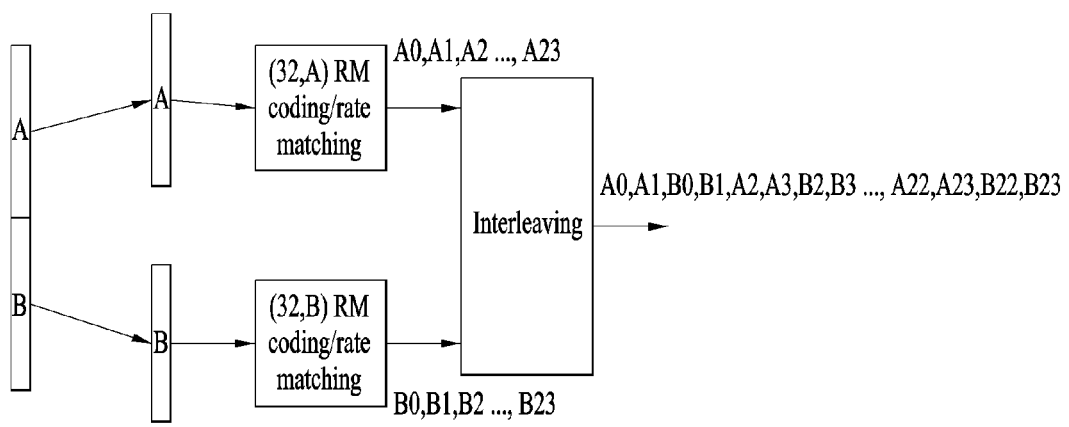
FIG. 16 illustrates a method of interleaving an output code bit when the dual RM mentioned earlier in FIG. 15 is applied.

FIG. 16 illustrates a method of interleaving an output code bit when the dual RM mentioned earlier in FIG. 15 is applied.

Referring to FIG. 16, when a data block (i.e., UCI) of a length A and a data block of a length B are inputted to (32, A) RN encoder and (32, B) RM encoder, respectively, an output coded bit is rate-matched by 24 bits and becomes A0, A1, . . . , A23 and B0, B1, . . . , B23, respectively.

The coded bits A0, A1, . . . , A23 and B0, B1, . . . , B23 are inputted to an interleaver and each of the coded bits outputted from the interleaver is sequentially outputted by two bits and forms a bit sequence such as A0, A1, B0, B1, A2, A3, B2, B3, . . . , A22, A23, B22, B23. QPSK modulation is performed on the bit sequence. The first 24 bits (12 QPSK symbol) of the bit sequence are mapped to a first slot and the latter 24 bits (12 QPSK symbol) of the bit sequence are mapped to a second slot in accordance with a transmission form of the PUCCH format 3.

Polar Code

A polar code is known as a channel code capable of obtaining channel capacity in a binary-input discrete memoryless channel (B-DMC). In particular, the polar code corresponds to a channel code capable of obtaining error-free channel capacity by infinitely increasing a size (N) of a code block. An encoder of the polar code can perform two procedures including channel combining and channel splitting.

Figure 17:
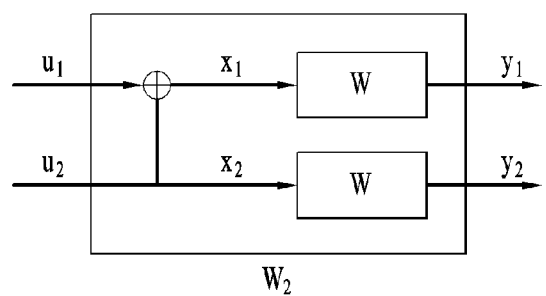
FIG. 17 illustrates a first level channel combining procedure performed by polar coding.

The channel combining corresponds to a procedure of concatenating B-DMC channels in parallel to determine a size of a code block. FIG. 17 illustrates a first level channel combining procedure performed by polar coding. In particular, FIG. 17 shows a case of combining two B-DMC channels (W).

In this case, u1 and u2 are binary-input source bits and y1 and y2 are output coded bits. In this case, assume that the entire equivalent channels correspond to W2. When the N number of B-DMC channels is combined, each channel can be represented in a recursive form. In particular, in case of a generator matrix $G_N$, where $x_1^N = u_1^N G_N$ becomes $x_1^N = \{x_1, \ldots, x_N\}$, $u_1^N = \{u_1, \ldots, u_N\}$, the $G_N$ can be calculated as follows.

$$G_N = B_N F^{\otimes n}, N = 2^n, F = \begin{bmatrix} 1 & 0 \\ 1 & 1 \end{bmatrix}, \quad \text{[Equation 1]}$$

$$F^{\otimes n} = F \otimes F^{\otimes (n-1)}, F^{\otimes 0} = 1, B_N = R_N\left(I_2 \otimes B_{\frac{N}{2}}\right)$$

In equation 1, RN corresponds to a bit-reversal interleaver. In particular, the RN makes an output $x_1^N - (s_1, s_3, \ldots, s_{N-1}, s_2, \ldots, s_N)$ to be mapped to input $s_1^N$. This relation is shown in FIG. 18. FIG. 18 illustrates an N level channel combining procedure performed by polar coding. In this case, a size (N) of a code block is restricted to $2^n$ (n is natural number).

A procedure of defining an equivalent channel for a specific input after the N number of B-DMC channels is combined is called channel splitting. The channel splitting can be represented by channel transition probability described in the following.

$$W_N^{(i)}(y_1^N, u_1^{i-1} | u_i) = \sum_{u_{i+1}^N} \frac{1}{2^{N-1}} W_N(y_1^N | u_1^N) \quad \text{[Equation 2]}$$

After the channel combining and the channel splitting are performed, it may be able to obtain a theorem shown in table 5 in the following.

TABLE 5

Theorem: For any B-DMC W, the channels $\{W_N^{(i)}\}$ polarize in the sense that, for any fixed $\delta \in (0, 1)$, as N goes to infinity through powers of two, the fraction of indices $i \in \{1, \ldots, N\}$ for which $I(W_N^{(i)}) \in (1 - \delta, 1]$ goes to
$I(W)$ and the fraction for which $I(W_N^{(i)}) \in [0, \delta)$ goes to $1- I(W)$. Hence, as N → ∞, channels polarize, either completely noisy or noise free and we know these channels exactly at the transmitter. So, we fix bad channels and
transmit uncoded bits over good ones.

In particular, if a size (N) of a code block becomes infinite, an equivalent channel for a specific input bit is divided into a noisy channel and a noise-free channel. This indicates that capacity of the equivalent channel for the specific input bit is divided into 0 and I (W).

A decoding scheme of a polar code corresponds to a successive cancellation (SC) decoding scheme. The SC decoding scheme calculates a channel transition probability to calculate a likelihood ratio (LLR) for an input bit. In this case, the channel transition probability can be calculated in a recursive form using a characteristic that the channel combining procedure and the channel splitting procedure are formed in a recursive form.

Hence, the LLR can also be calculated in a recursive form. First of all, channel transition probability $w_N^{(i)}(y_1^N, u_1^{i-1}|u_i)$ for an input bit ($u_i$) can be calculated using equations 3 and 4. In this case, it may be able to represent $u_1^i$ as $u_{1,o}^i$, $u_{1,e}^i$ in a manner of dividing the $u_1^i$ into an odd index and an even index.

$$W_{2N}^{(2i-1)}(y_1^{2N}, u_1^{2i-2}|u_{2i-1}) = \sum_{u_{2i}^{2N}} \frac{1}{2^{2N-1}} W_{2N}(y_1^{2N}|u_1^{2N}) \quad \text{[Equation 3]}$$

$$= \sum_{u_{2i,o}^{2N}, u_{2i,e}^{2N}} \frac{1}{2^{2N-1}}$$

$$W_N(y_1^N | u_{1,o}^{2N} \oplus u_{1,e}^{2N})$$

$$W_N(y_{N+1}^{2N} | u_{1,e}^{2N})$$

$$= \sum_{u_{2i}^{2N}} \frac{1}{2} \sum_{u_{2i+1,o}^{2N}} \frac{1}{2^{N-1}}$$

$$W_N(y_{N+1}^{2N} | u_{1,e}^{2N}) \cdot$$

$$\sum_{u_{2i+1,o}^{2N}} \frac{1}{2^{N-1}}$$

$$W_N(y_1^N | u_{1,o}^{2N} \oplus u_{1,e}^{2N})$$

$$= \sum_{u_{2i}} \frac{1}{2} W_N^{(i)}$$

$$(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

using the definition of $$W_N^{(i)}(y_1^N, u_1^{i-1}|u_i) = \sum_{u_{i+2}^N} \frac{1}{2^{N-1}} W_N(y_1^N|u_1^N)$$

$$W_N^{(2i)}(y_1^{2N}, u_1^{2i-1}|u_{2i}) = \sum_{u_{2i+1}^{2N}} \frac{1}{2^{2N-1}} W_{2N}(y_1^{2N}|u_1^{2N}) \quad \text{[Equation 4]}$$

$$= \sum_{u_{2i+1,o}^{2N}, u_{2i+1,e}^{2N}} \frac{1}{2^{2N-1}}$$

$$W_N(y_1^N | u_{1,o}^{2N} \oplus u_{1,e}^{2N})$$

$$W_N(y_{N+1}^{2N} | u_{1,e}^{2N})$$

$$= \frac{1}{2} \sum_{u_{2i+1,e}^{2N}} \frac{1}{2^{N-1}}$$

$$W_N(y_{N+1}^{2N} | u_{1,e}^{2N}) \cdot$$

$$\sum_{u_{2i+1,o}^{2N}} \frac{1}{2^{N-1}}$$

$$W_N(y_1^N | u_{1,o}^{2N} \oplus u_{1,e}^{2N})$$

$$= \frac{1}{2} W_N^{(i)}$$

$$(y_1^N, u_{1,o}^{2i-2} \oplus u_{1,e}^{2i-2} | u_{2i-1} \oplus u_{2i}) \cdot$$

$$W_N^{(i)}(y_{N+1}^{2N}, u_{1,e}^{2i-2} | u_{2i})$$

Then, LLR $$L_N^{(i)} = \frac{w_N^{(i)}(y_1^N, \hat{u}_1^{i-1} | 0)}{w_N^{(i)}(y_1^N, \hat{u}_1^{i-1} | 1)}$$

can be calculated as follows.

$$L_N^{(2i-1)}(y_1^N, \hat{u}_1^{2i-2}) = \quad \text{[Equation 5]}$$

$$\frac{L_{N/2}^{(i)}(y_1^{N/2}, \hat{u}_{1,o}^{2i-2} \oplus \hat{u}_{1,e}^{2i-2}) L_{N/2}^{(i)}\left(y_{\frac{N}{2}+1}^N, \hat{u}_{1,e}^{2i-2}\right) + 1}{L_{N/2}^{(i)}(y_1^{N/2}, \hat{u}_{1,o}^{2i-2} \oplus \hat{u}_{1,e}^{2i-1}) L_{N/2}^{(i)}\left(y_{\frac{N}{2}+1}^N, \hat{u}_{1,e}^{2i-2}\right)},$$

$$L_N^{(2i)}(y_1^N, \hat{u}_1^{2i-1}) =$$

$$[L_{N/2}^{(i)}(y_1^{N/2}, \hat{u}_{1,o}^{2i-2} \oplus \hat{u}_{1,e}^{2i-2})]^{1-2\hat{u}_{2i-1}} \cdot L_{N/2}^{(i)}\left(y_{\frac{N}{2}+1}^N, \hat{u}_{1,e}^{2i-2}\right)$$

Since arithmetic symbols used in all equations of the embodiments of the present invention and a general arithmetic symbol are used as the same meaning, detail explanation on the arithmetic symbols is omitted. In case of interpreting the equations, the equations can be interpreted using a definition identical to the definition of the general arithmetic symbol.

Complexity of a polar encoder and an SC decoder vary depending on a length (N) of a code block. In general, it is known as the polar encoder and the SC decoder have complexity of O(N log N).

When an input bit of K bits is assumed in a polar code of a length N, a coding rate becomes N/K. In this case, if a size of a data payload corresponds to N and a generator matrix of the polar encoder corresponds to $G_N$, an encoded bit can be represented as $x_1^N = u_1^N G_N$. In this case, assume that K number of bits among $u_1^N$ corresponds to a payload bit, a row index of $G_N$ corresponding to the payload bit corresponds to I, and a row index of $G_N$ corresponding to the remaining N-K number of bits corresponds to F. A minimum distance of the polar code is defined as follows.

$$d_{min}(C) = \min_{i \in I} 2^{wt(i)} \quad \text{[Equation 6]}$$

In equation 6, wt(i) corresponds to number of ones in the binary expansion of i (i=0, 1, . . . , N-1). In particular, wt(i) corresponds to the number of ones when an index of a channel on which actual information is transmitted is represented by a binary number.

In the following, a method of applying polar coding to a mobile (or wireless) communication system is proposed.

As mentioned in the foregoing description, an equivalent channel is divided into a noisy channel and a noise-free channel after the channel combining procedure and the channel splitting procedure are performed. In this case, a data payload should be transmitted on the noise-free channel. In particular, in order to obtain preferred performance, the data payload should be transmitted on the noise-free equivalent channel. In this case, a method of finding out the noise-free equivalent channel can be determined by calculating $Z(W)-\Sigma\sqrt{W(y|0)W(y|1)}$ of an equivalent channel for each input bit. The Z(W) is called a Battacharyya parameter. The Z(W) corresponds to a upper-bound value of an error probability when MAP decision is performed by transmitting a binary input 0 or 1. Hence, if the Z(W) is calculated and arranged in an ascending order, it may be able to select and transmit data payload on a noise-free channel as much as you can.

The Z(W) can be calculated for a BEC (binary erasure channel) using equation 7 described in the following.

$$Z(W_N^{(i)}) = Z(W_{(b_1,b_2,\ldots,b_{k-1})}) =$$ [Equation 7]
$$\begin{cases} 2Z(W_{(b_1,b_2,\ldots,b_{k-1})}) - Z(W_{(b_1,b_2,\ldots,b_{k-1})})^2, & \text{if } b_k = 0 \\ Z(W_{(b_1,b_2,\ldots,b_{k-1})})^2, & \text{if } b_k = 1 \end{cases}$$

When erasure probability of a BEC channel corresponds to 0.5 and a size of a code block corresponds to 8, the Z(W) can be calculated as follows using the equation 7. Z(W) ={1.00, 0.68, 0.81, 0.12, 0.88, 0.19, 0.32, 0.00}. Hence, if a size of a data payload corresponds to 2, the data payload can be transmitted on an equivalent channel 8 (Z(W)=0.00) and an equivalent channel 4 (Z(W)=0.12).

A data payload of a mobile communication system is transmitted by attaching a CRC to the data payload to detect an error. When SC decoding is performed, if a CRC is used for the decoding, it may be able to improve decoding capability. In this case, in order to improve the decoding capability, it is necessary to make the CRC have reliability higher than that of a normal payload. To this end, when a position of a CRC bit sequence is listed in an ascending order of Z(w), if the bit sequence is arranged to a corresponding equivalent channel as much as a length of a CRC and then a data payload is arranged thereafter, it may be able to improve the decoding capability. For example, as shown in equation 10, when 5 bits are transmitted by attaching a 2-bit CRC to a 3-bit payload using a polar encoder of a length of 8, the 2-bit CRC is arranged to equivalent channels 8 and 4 and then a data payload is transmitted on equivalent channels 6, 7 and 2.

As shown in equation 7, a method of calculating the Z(W) is satisfied on a BEC channel only. In case of an AWGN channel, an equivalent channel for transmitting a payload can be found using a different method. Similarly, the calculated Z(W) is arranged in an ascending order, an equivalent channel is assigned to a CRC bit as much as a CRC length, and then a data payload is arranged to the remaining equivalent channels.

As a different method, if SC decoding is not assumed by a receiving side, reliability of a CRC bit and reliability of a data payload are identically considered. Hence, when the Z(W) is arranged in an ascending order, the data payload is preferentially allocated to equivalent channels of good performance, and then the CRC bit is allocated to the remaining equivalent channels.

Equivalent channels to be allocated to a data payload should be known to both a transmitting side and a receiving side according to a size of the data payload including a CRC bit and a coding rate. It is preferable for a transmitting end to calculate the equivalent channels to be allocated to the data payload in advance.

Hence, if the transmitting side transmits information on a size of a data payload and information on a coding rate to the receiving side, the receiving side obtains information on an equivalent channel on which the data payload is transmitted and may be then able to perform decoding on a polar coded data signal.

When a polar encoder has a coding rate r=K/N, an encoded code block size corresponds to N and a payload size corresponds to K. In this case, a bit sequence corresponding to N−K is a bit sequence allocated and transmitted on a noisy channel. In this case, it is preferable that information on the bit sequence is known to a receiving side in advance. Hence, it is preferable to determine a bit sequence by a transmitting side and a receiving side in advance. For example, a bit sequence to be allocated to a noisy channel can be determined by {0, 0, . . . , 0} or {1, 1, . . . , 1} corresponding to a bit sequence size N−K.

Since a size of an encoded code block is restricted to $2^n$ (n is a natural number), a polar encoder performs a rate matching operation such as puncturing or repetition according to transmission numerology of a system. Assume that a size of a codeword, which is encoded for a data payload including a CRC, generated by a higher layer satisfies such a relation as $2^n < N < 2^{n+1}$. The identical scheme can be applied not only to higher layer data but also to a payload (e.g., DCI, UCI) transmitted on a control channel. In this case, if a first threshold value (THR1) of a codeword size exists and the codeword size is greater than the first threshold, a transmitting side performs encoding using a mother polar encoder of a size of $2^{n+1}$ and performs puncturing as much as $2^{n+1}-N$ bits to generate an encoded bit sequence of a codeword size N. In this case, it is preferable to satisfy such a relation as data payload size $K>2^n$. In this case, the mother polar encoder corresponds to a reference encoder for performing repetition or puncturing according to a size of a data payload.

Meanwhile, if a size of a data payload is less than a second threshold value (THR2) (i.e., since coding rate=payload size/codeword size, a coding rate is less than a prescribed threshold), a transmitting side performs encoding using a mother polar encoder of a size of $2^n$ and performs repetition as much as $N-2^n$ bits to generate an encoded bit sequence of a codeword block size N. In this case, it is preferable to satisfy such a relation as data payload size $K<2^y$. In this case, the THR1 and the THR2 may correspond to the same value or a different value. In this case, a threshold value such as the THR1 and the THR2 may vary depending on n. For example, since such a relation as $2^7<200<2^8$ is satisfied for a codeword length 200, it is able to generate a code word having a length of 200 by performing repetition on a polar code of 128 bits or performing puncturing on a polar code of 256 bits. If THR1=THR2=192 is assumed, since 200>192, it may be able to generate a codeword having a length of 200 by performing puncturing on the polar code of 256 bits. As a different method, it may consider methods described in the following.

1. When a codeword length $2^n<N<2^{n+1}$ is satisfied, a method of selecting a smaller polar encoder from among $N-2^n$ and $N-2^{n+1}$: When $N-2^n>N-2^{n+1}$, puncturing is performed on $2^{n+1}$ polar code to generate a codeword. When $N-2^n<N-2^{n+1}$, repetition is performed on $2^n$ polar code to generate a codeword.

2. When a codeword length $2^n<N<2^{n+1}$ is satisfied, a method of generating a codeword by performing repetition on $2^n$ polar code.

3. When a codeword length $2^n<N<2^{n+1}$ is satisfied, a method of generating a codeword by performing puncturing on $2^{n+1}$ polar code.

If a generator matrix of a polar encoder of a data payload size N corresponds to $G_N$, an encoded bit can be represented by $x_1^N = u_1^N G_N$. In this case, the number of 1s included in a column of the $G_N$ can be defined as a weight of the column. In case of performing repetition using the $G_N$ as a mother polar encoder, if the repetition is performed in a descending order of a weight of column, it may be able to maximize a distance of a codeword on which the repetition is performed.

Similarly, in case of performing puncturing using the $G_N$ as a mother polar encoder, if the puncturing is performed in an ascending order of a weight of column, it may be able to maximize a distance of a codeword on which the puncturing is performed. A matrix described in the following corresponds to a generator matrix of a polar encoder where the N corresponds to 8.

Equation 8 in the following shows an example of a generator matrix of a polar encoder where the N corresponds to 8.

$$G_8 = \begin{bmatrix} 1 & 0 & 0 & 0 & 0 & 0 & 0 & 0 \\ 1 & 0 & 0 & 0 & 1 & 0 & 0 & 0 \\ 1 & 0 & 1 & 0 & 0 & 0 & 0 & 0 \\ 1 & 0 & 1 & 0 & 1 & 0 & 1 & 0 \\ 1 & 1 & 0 & 0 & 0 & 0 & 0 & 0 \\ 1 & 1 & 0 & 0 & 1 & 1 & 0 & 0 \\ 1 & 1 & 1 & 1 & 0 & 0 & 0 & 0 \\ 1 & 1 & 1 & 1 & 1 & 1 & 1 & 1 \end{bmatrix} \qquad [\text{Equation 8}]$$

In a polar encoder having the generator matrix shown in equation 8, a weight of each column becomes {8, 4, 4, 2, 4, 2, 2, 1}. Hence, when a codeword of a length=10 is transmitted, a column 1 and one of column 2, 3, and 5 are selected and transmitted. In particular, codewords 1 to 8 are encoded using the generator matrix and the remaining two codewords are repeatedly encoded by using the column 1 and one selected from among the column 2, the column 3, and the column 5. If the column 1 and the column 2 are selected, a new generator matrix corresponds to $G'_8 = [G_8\ G_r]$, $G_r = [G_8(:,1)\ G_8(:,2)]$. In this case, the $G_8(:,1)$ corresponds to a column vector indicating an $x^{th}$ column of the $G_8$.

Similarly, when a codeword of a length C=6 is transmitted, a column 8 and one of columns 4, 6, and 7 are punctured. If the column 8 and the column 4 are selected, a generator matrix can be represented by equation 9 in the following.

$$G_6 = \begin{bmatrix} 1 & 0 & 0 & 0 & 0 & 0 \\ 1 & 0 & 0 & 1 & 0 & 0 \\ 1 & 0 & 1 & 0 & 0 & 0 \\ 1 & 0 & 1 & 1 & 0 & 1 \\ 1 & 1 & 0 & 0 & 0 & 0 \\ 1 & 1 & 0 & 1 & 1 & 0 \\ 1 & 1 & 1 & 0 & 0 & 0 \\ 1 & 1 & 1 & 1 & 1 & 1 \end{bmatrix} \qquad [\text{Equation 9}]$$

Equation 9 shows a new generator matrix which is generated by performing puncturing on the column 8 and the column 4 of equation 8.

If column-permutation is performed on columns of a generator matrix of a polar encoder in a descending order or an ascending order of a weight, it may be able to easily implement puncturing and repetition. In particular, if a column weight is arranged in a descending order, repetition is performed in an order of a column index and puncturing is performed in a reverse order of the column index. If a column weight is arranged in an ascending order, repetition is performed in a reverse order of a column index and puncturing is performed in an order of the column index. By doing so, it may be able to maximally configure a minimum distance of a codeword mentioned earlier in equation 9.

Equation 10 in the following shows a case that permutation is performed on a generator matrix shown in equation 11 in an order of a column weight.

$$G_8 = \begin{bmatrix} 1 & 0 & 0 & 0 & 0 & 0 & 0 & 0 \\ 1 & 0 & 0 & 1 & 0 & 0 & 0 & 0 \\ 1 & 0 & 1 & 0 & 0 & 0 & 0 & 0 \\ 1 & 0 & 1 & 1 & 0 & 0 & 1 & 0 \\ 1 & 1 & 0 & 0 & 0 & 0 & 0 & 0 \\ 1 & 1 & 0 & 1 & 0 & 1 & 0 & 0 \\ 1 & 1 & 1 & 0 & 1 & 0 & 0 & 0 \\ 1 & 1 & 1 & 1 & 1 & 1 & 1 & 1 \end{bmatrix} \qquad [\text{Equation 10}]$$

As a method of performing puncturing, it may consider a minimum distance of a punctured polar code. In a generator matrix shown in equation 8, if a payload size corresponds to 2, since a payload is transmitted via an equivalent channel corresponding to a row 8 and a row 4 of equation 7, such a matrix as $$\begin{bmatrix} 1 & 0 & 1 & 0 & 1 & 0 & 1 & 0 \\ 1 & 1 & 1 & 1 & 1 & 1 & 1 & 1 \end{bmatrix}$$

becomes a generator submatrix corresponding to 2-bit payload. In order to generate 6-bit output codeword, it is necessary to perform puncturing on 2 bits. In this case, when puncturing is performed on a column of a small column weight, it is preferable to perform puncturing on a column corresponding to 0 of a first row. In case of performing puncturing on a second column and a fourth column, a generator matrix generating 6-bit payload is given as shown in equation 11 in the following.

$$G_6 = \begin{bmatrix} 1 & 0 & 0 & 0 & 0 & 0 \\ 1 & 0 & 1 & 0 & 0 & 0 \\ 1 & 1 & 0 & 0 & 0 & 0 \\ 1 & 1 & 1 & 0 & 1 & 0 \\ 1 & 0 & 0 & 0 & 0 & 0 \\ 1 & 0 & 1 & 1 & 0 & 0 \\ 1 & 1 & 0 & 0 & 0 & 0 \\ 1 & 1 & 1 & 1 & 1 & 1 \end{bmatrix} \qquad [\text{Equation 11}]$$

In particular, column puncturing is performed in an ascending order of a column weight of a sub-matrix consisting of rows of a generator matrix corresponding to a payload. If the column weight is the same, priority is provided in an ascending order of a column index to perform puncturing. Or, priority is provided in a descending order of a column index to perform puncturing. In case of performing puncturing in a descending order of a column index, a sixth column and an eighth column of equation 8 are punctured and it may be able to obtain a generator matrix shown in equation 12 in the following.

$$G_6 = \begin{bmatrix} 1 & 0 & 0 & 0 & 0 & 0 \\ 1 & 0 & 0 & 0 & 1 & 0 \\ 1 & 0 & 1 & 0 & 0 & 0 \\ 1 & 0 & 1 & 0 & 1 & 1 \\ 1 & 1 & 0 & 0 & 0 & 0 \\ 1 & 1 & 0 & 0 & 1 & 0 \\ 1 & 1 & 1 & 1 & 0 & 0 \\ 1 & 1 & 1 & 1 & 1 & 1 \end{bmatrix} \quad \text{[Equation 12]}$$

As mentioned in the foregoing description, when a new generator matrix is obtained by performing puncturing and repetition, if a row or a column is configured by the same element, performance deterioration may occur. Hence, it may be able to configure a generator matrix by performing puncturing or repetition on a column corresponding to a next priority.

An input of a polar encoder is classified into a bit channel to which information data is mapped and a bit channel to which information data is not mapped. According to a theory of a polar code, as a codeword of the polar code becomes infinite, an input bit channel can be divided into a noise-free channel and a noisy channel. Hence, if information is assigned to the noise-free channel, it may obtain channel capacity. Yet, since it is unable to configure a codeword of infinite length, reliability of an input bit channel is calculated and a data bit is allocated according to an order of the calculated reliability of the input bit channel. In this case, a bit channel to which the data bit is allocated is referred to as "good bit channel" in the present invention. In particular, the good bit channel corresponds to an input bit channel to which a data bit is mapped. A bit channel to which data is not mapped is referred to as a frozen bit channel. In general, encoding is performed in the frozen bit channel by 0 (if a value is known to transmitting/receiving end, any value is possible) is mapped to the frozen channel.

When puncturing or repetition is performed, it may utilize information on a good bit channel which is obtained by performing polar encoding. In particular, it may be able to perform puncturing on a codeword bit position corresponding to a position of an input bit not allocated to an information bit. In this case, as shown in equation 7, in case of performing puncturing on a plurality of codeword bits by utilizing a result of calculating reliability of an information bit channel, it may be able to perform puncturing on the codeword bits in an ascending order of an index of reliability. The reliability information of the information bit channel can also be calculated using such a method as density evolution, and the like. It may be able to perform puncturing in an ascending order of reliability. In case of performing repetition on a plurality of codeword bits, the repetition can be preferentially performed on a codeword bit corresponding to an index of a higher reliability of a bit channel. For example, if reliability of an information bit of a polar code having a generator matrix shown in equation 8 is calculated using equation 7, it may have Z(W)={1.00, 0.68, 0.81, 0.12, 0.88, 0.19, 0.32, 0.00}. In this case, when puncturing is performed on 2 bits, since 1 and 0.88 of the Z(W) become a first and a second biggest values, puncturing is performed on a codeword bit 1 and a codeword bit 5. Meanwhile, when repetition is performed on 2 bits, since 0.00 and 0.12 of the Z(W) become a first and a second smallest values, repetition is performed on a codeword bit 4 and a codeword bit 8.

As a different method, it may be able to evenly perform puncturing or repetition on a codeword. For example, when a codeword length corresponds to 256 bits and puncturing or repetition is performed on 16 bits, it may be able to perform puncturing or repetition on the codeword with an interval of 16 bits (256/16=16).

As a further different method, it may be able to calculate importance of a codeword bit and may be able to perform puncturing or repetition according to the importance. The importance of the codeword bit can be obtained from FER or the like when puncturing or repetition is performed on a specific bit constructing the codeword bit. Puncturing can be performed on a codeword bit of a low FER first. Repetition can be performed on a codeword bit of a low FER first.

Table 6 in the following shows an order of importance of a codeword bit of a codeword of (512, 400) polar code. In this case, (n, k) corresponds to a codeword length n and a payload size k and a payload can include a CRC.

TABLE 6

| 범위 | bit index | | | | | | | | | | | | | | | |
|---|---|---|---|---|---|---|---|---|---|---|---|---|---|---|---|---|
| 1~32 | 15 | 288 | 410 | 182 | 3 | 190 | 5 | 188 | 427 | 122 | 131 | 149 | 457 | 225 | 308 | 238 | 296 |
| 33~64 | 132 | 509 | 464 | 501 | 455 | 462 | 157 | 255 | 346 | 281 | 400 | 441 | 32 | 111 | 240 | 294 | 10 |
| 65~96 | 189 | 289 | 325 | 179 | 440 | 86 | 354 | 384 | 115 | 163 | 178 | 227 | 300 | 336 | 201 | 264 | 379 |
| 97~128 | 387 | 409 | 17 | 116 | 186 | 262 | 448 | 395 | 496 | 196 | 58 | 164 | 344 | 385 | 458 | 66 | 481 |
| 129~160 | 233 | 167 | 214 | 170 | 370 | 137 | 242 | 331 | 408 | 415 | 202 | 361 | 402 | 285 | 147 | 237 | 243 |
| 161~192 | 169 | 275 | 425 | 471 | 104 | 114 | 168 | 181 | 195 | 216 | 251 | 399 | 129 | 160 | 286 | 329 | 371 |
| 193~224 | 413 | 145 | 162 | 65 | 418 | 511 | 22 | 151 | 200 | 218 | 360 | 49 | 141 | 144 | 226 | 231 | 414 |
| 225~256 | 222 | 313 | 404 | 87 | 261 | 338 | 437 | 381 | 423 | 229 | 235 | 435 | 23 | 307 | 322 | 383 | 461 |
| 257~288 | 67 | 269 | 443 | 488 | 2 | 109 | 291 | 26 | 318 | 53 | 304 | 356 | 93 | 94 | 349 | 46 | 102 |
| 289~320 | 21 | 59 | 77 | 121 | 368 | 451 | 51 | 91 | 241 | 363 | 495 | 154 | 193 | 401 | 450 | 7 | 36 |
| 321~352 | 172 | 367 | 436 | 128 | 236 | 380 | 452 | 133 | 146 | 258 | 341 | 56 | 136 | 138 | 194 | 355 | 419 |
| 253~384 | 41 | 43 | 135 | 166 | 249 | 386 | 493 | 266 | 468 | 378 | 422 | 108 | 343 | 25 | 252 | 433 | 487 |
| 385~416 | 119 | 490 | 449 | 416 | 47 | 69 | 82 | 89 | 277 | 507 | 19 | 35 | 297 | 106 | 204 | 301 | 390 |
| 417~448 | 120 | 152 | 205 | 372 | 6 | 359 | 398 | 447 | 467 | 40 | 198 | 421 | 79 | 295 | 72 | 273 | 284 |
| 449~480 | 68 | 309 | 420 | 4 | 210 | 365 | 88 | 130 | 283 | 388 | 456 | 29 | 71 | 337 | 373 | 76 | 245 |
| 481~512 | 211 | 78 | 125 | 426 | 221 | 350 | 428 | 459 | 314 | 62 | 177 | 156 | 159 | 267 | 497 | 197 | 279 |

| 범위 | bit index | | | | | | | | | | | | | | | |
|---|---|---|---|---|---|---|---|---|---|---|---|---|---|---|---|---|
| 1~32 | 64 | 38 | 18 | 260 | 470 | 316 | 263 | 274 | 80 | 339 | 389 | 477 | 44 | 319 | 369 |
| 33~64 | 12 | 174 | 256 | 463 | 34 | 215 | 512 | 311 | 85 | 282 | 392 | 406 | 411 | 482 | 505 |
| 65~96 | 1 | 244 | 405 | 434 | 191 | 310 | 364 | 432 | 430 | 180 | 224 | 234 | 246 | 276 | 303 |
| 97~128 | 74 | 271 | 142 | 382 | 454 | 75 | 112 | 185 | 473 | 247 | 278 | 305 | 429 | 61 | 63 |
| 129~160 | 292 | 499 | 84 | 113 | 217 | 259 | 287 | 394 | 475 | 199 | 239 | 321 | 506 | 8 | 97 |
| 161~192 | 472 | 11 | 13 | 20 | 123 | 158 | 293 | 377 | 42 | 52 | 90 | 95 | 153 | 161 | 257 |

TABLE 6-continued

| | | | | | | | | | | | | | | | |
|---|---|---|---|---|---|---|---|---|---|---|---|---|---|---|---|
| 193~224 | 417 | 391 | 50 | 140 | 219 | 412 | 37 | 48 | 100 | 320 | 333 | 503 | 280 | 302 | 124 |
| 225~256 | 30 | 81 | 393 | 99 | 184 | 213 | 474 | 480 | 33 | 126 | 165 | 232 | 173 | 407 | 60 |
| 257~288 | 155 | 466 | 491 | 57 | 253 | 254 | 290 | 438 | 492 | 508 | 96 | 212 | 439 | 442 | 510 |
| 289~320 | 70 | 192 | 446 | 465 | 476 | 223 | 328 | 342 | 494 | 272 | 299 | 334 | 340 | 351 | 150 |
| 321~352 | 431 | 117 | 230 | 27 | 55 | 110 | 187 | 306 | 332 | 335 | 347 | 483 | 220 | 358 | 486 |
| 253~384 | 39 | 208 | 374 | 460 | 9 | 326 | 92 | 248 | 366 | 107 | 469 | 484 | 444 | 315 | 118 |
| 385~416 | 207 | 330 | 500 | 73 | 83 | 206 | 250 | 453 | 362 | 489 | 54 | 209 | 14 | 323 | 397 |
| 417~448 | 376 | 24 | 45 | 16 | 103 | 348 | 101 | 353 | 485 | 31 | 270 | 327 | 445 | 498 | 105 |
| 449~480 | 478 | 175 | 352 | 298 | 98 | 203 | 171 | 143 | 268 | 265 | 134 | 403 | 183 | 375 | 228 |
| 481~512 | 139 | 176 | 127 | 148 | 317 | 357 | 504 | 396 | 424 | 28 | 345 | 479 | 502 | 312 | 324 |

Table 6 shows an order of importance of a codeword bit when puncturing is performed on a codeword having a length of 512 bits.

Figure 19:
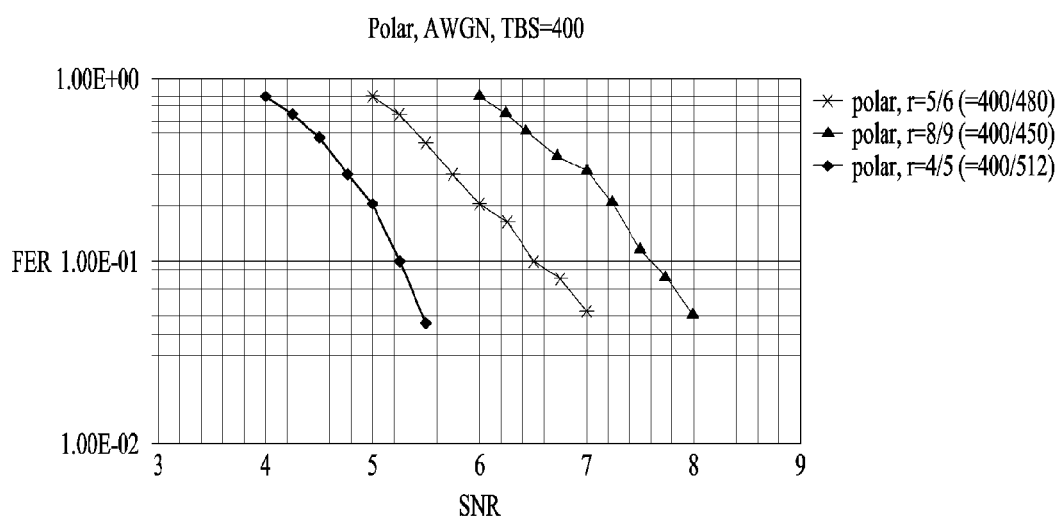
FIG. 19 shows performance of (480, 400) polar code corresponding to a coding rate 5/6 and performance of (450, 400) polar code corresponding to a coding rate 8/9, which are obtained from (512, 400) codeword by performing puncturing on 32 bits and 62 bits in consideration of importance of a codeword bit shown in table 6.

FIG. 19 shows performance of (480, 400) polar code corresponding to a coding rate 5/6 and performance of (450, 400) polar code corresponding to a coding rate 8/9, which are obtained from (512, 400) codeword by performing puncturing on 32 bits and 62 bits in consideration of importance of a codeword bit shown in table 6.

Table 6 shows an order of importance of a codeword bit when puncturing is performed. When repetition is performed, it may use the table 6. In particular, repetition can be performed in a reverse order of the importance of the codeword bit shown in table 6.

In case of using polar coding, it is necessary to implement incremental redundancy (IR) to obtain HARQ gain. The IR corresponds to a transmission scheme for maximally obtain a coding gain by differentiating a redundancy version when retransmission is performed. When the retransmission is performed, assume that a data payload size (N) is not changed. When the retransmission is performed, it is necessary to maximize a polar coding gain by determining a puncturing pattern and a repetition pattern of polar coding.

Case 1: When Transmission of a Data Payload Including Initial Transmission is Performed by Puncturing, it may be able to perform puncturing as many as the number of puncturing bits in an ascending order of a column weight of a generator matrix. When puncturing is performed on a bit sequence corresponding to all columns, the same puncturing pattern is started again. If columns have the same weight, an order can be determined. For example, it may be able to determine an order of a column index of a generator matrix. When the generator matrix shown in equation 8 is assumed, in case of considering an order of a small weight of a column and the same weight, puncturing is performed in an order of a column 8, a column 4, a column 6, a column 7, a column 2, a column 3, a column 5, and a column 1. In particular, in case of transmitting 6-bit codeword by performing puncturing on 2 bits at initial transmission, puncturing is performed on an $8^{th}$ bit and a $4^{th}$ bit. If puncturing is performed on 3 bits at second transmission, puncturing is performed on a $6^{th}$ bit, a $7^{th}$ bit, and a $2^{nd}$ bit. If puncturing is performed on 4 bits at third transmission, puncturing is performed on a $3^{rd}$ bit, a $5^{th}$ bit, a $1^{st}$ bit, and an $8^{th}$ bit. If permutation is performed on a column of a generator matrix in an order of a weight of the column, puncturing is performed in a reverse order of a column index.

Case 2: When Transmission of a Corresponding Payload Including Initial Transmission is Performed by Repetition, it may be able to perform repetition as many as the number of repetition bits in a descending order of a column weight of a generator matrix. When repetition is performed on a bit sequence corresponding to all columns, the same repetition pattern is started again. If columns have the same weight, an order can be determined. For example, it may be able to determine an order of a column index of a generator matrix. When the generator matrix shown in equation 8 is assumed, in case of considering an order of a big weight of a column and the same weight, repetition is performed in an order of a column 1, a column 2, a column 3, a column 5, a column 4, a column 6, a column 7, and a column 8. In particular, in case of transmitting 10-bit codeword by performing repetition on 2 bits at initial transmission, repetition is performed on a $1^{st}$ bit and a $2^{nd}$ bit. If repetition is performed on 3 bits at second transmission, repetition is performed on a $3^{rd}$ bit, a $5^{th}$ bit, and a $4^{th}$ bit. If repetition is performed on 4 bits at third transmission, repetition is performed on a $6^{th}$ bit, a $7^{th}$ bit, an $8^{th}$ bit, and a $1^{st}$ bit. If permutation is performed on a column of a generator matrix in an order of a weight of the column, repetition is performed in an order of a column index.

Case 3: When Transmission of a Corresponding Payload Including Initial Transmission is Performed by Both Puncturing and Repetition, Transmission is performed by independently applying the case 1 and the case 2 according to a puncturing pattern and a repetition pattern of previous transmission. In particular, if current transmission corresponds to repetition, the case 2 is applied in consideration of a transmission pattern corresponding to repetition of the previous transmission. Similarly, if current transmission corresponds to puncturing, the case 1 is applied in consideration of a transmission pattern corresponding to puncturing of the previous transmission. If permutation is performed on a column of a generator matrix in an order of a weight of the column, repetition is performed in an order of a column index and puncturing is performed in a reverse order of the column index.

Figure 20:
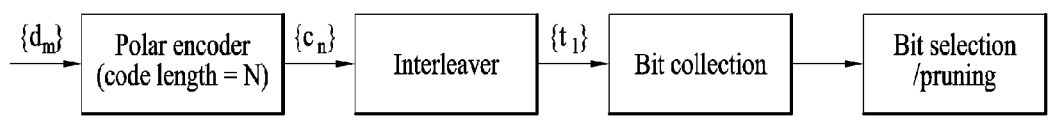
FIG. 20 illustrates a rate matching block diagram for polar coding.

FIG. 20 illustrates a rate matching block diagram for polar coding.

Referring to FIG. 20, information bit $\{d_m\}$ (m=1, . . . , K) is inputted to a polar encoder having a code length N and an encoded bit $\{c_n\}$ (n=1, . . . , N) is outputted via the polar encoder. Interleaving is performed on the encoded bit via an interleaver and the encoded bit becomes $\{t_l\}$ (l=1 . . . , N). Puncturing or repetition is performed on the $\{t_l\}$ (l=1 . . . , N) according to MCS and an allocated resource after being went through a bit collection unit. In particular, in case of transmitting M bits, if the M is less than N, it may transmit bits corresponding to the $\{t_l\}$ (l=1 . . . M). If the M is greater than the N, it may perform repetition on bits as many as $\{t_l\}$ (l=1 . . . M-N) and transmit the bits to the $\{t_l\}$ (l=1 . . . N).

If a transmission order of an encoded bit of the interleaver shown in FIG. 20 is changed, an interaction formula described in the following can be satisfied. l=π(n) In this case, the π(•) corresponds to an interleaving function. For clarity, an interleaver output is arranged in consideration of puncturing or repetition. In particular, bits on which puncturing is performed are sequentially arranged from the end part of a buffer and bits on which repetition is performed are sequentially arranged from the first part of the buffer. In this case, for clarity, assume that the buffer corresponds to a circular bugger of 1×N.

Embodiment 1: if a bit-reversal interleaver is assumed, an encoded bit is stored in a buffer in an order described in the following. In particular, the encoded bit is stored in the buffer in an order of $\{t_l\}$, $\pi(N)$, $\pi(N-1)$, ..., $\pi(1)$ (e.g., $l=\pi(N-l+1)$))

When actual transmission is performed, the transmission is performed in an order of $t_1, t_2, \ldots, t_N$.

Embodiment 2: if a random interleaver is assumed, an encoded bit is stored in a buffer in an order described in the following. In particular, the encoded bit is stored in the buffer in an order of $\{t_l\}$, $\pi(1)$, $\pi(2)$, ..., $\pi(N)$ (e.g., $l=\pi(l)$)). When actual transmission is performed, the transmission is performed in an order of $t_1, t_2, \ldots, t_N$. In this case, the random interleaver can be implemented by a pseudo code shown in Table 7 in the following.

TABLE 7 unsigned uniform(unsigned m); /* Returns a random integer 0 < = uniform(m) < = m−1 */
void initialize_and_permute(unsigned permutation[ ], unsigned n)
{
    unsigned i;
    for (i = 0; i <= n−2; i++) {
    unsigned j = uniform(n−i); /* A random integer such that 0 ≤ j < n−i*/
    swap(permutation[i], permutation[i+j]); /* Swap an existing element [i+j] to position [i]
*/
    }
}

As information bit size increases, a bigger code length N value is necessary. An information bit size equal to or greater than a prescribed value can be segmented by a code block equal to or less than a prescribed value in consideration of decoding latency or processing capability of a receiving side. In case of a polar code, since N value is restricted to $2^x$, if a maximum coding rate is assumed by 0.93 when the N corresponds to 8192, since 8192*0.93=7618.xxx including a CRC, it may be able to perform code block segmentation when the N is equal to or greater than 7620 bits.

Figure 21:
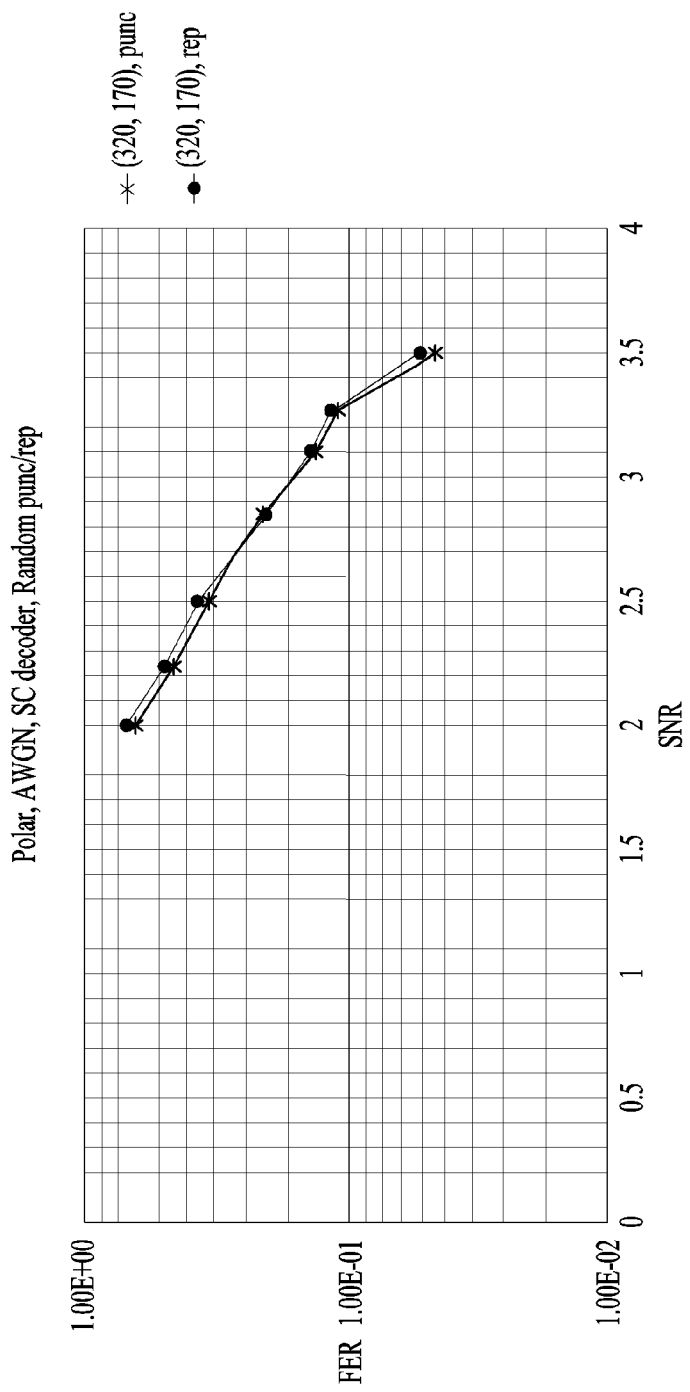
FIG. 21 illustrates performance comparison of (320, 170) polar code generated by puncturing/repetition.

FIG. 21 illustrates performance comparison of (320, 170) polar code generated by puncturing/repetition.

FIG. 21 shows performance comparison when an encoded bit of 320 bits is generated by performing puncturing on 192 bits after (512, 170) polar encoding is performed on information size 170 including a CRC and an encoded bit of 320 bits is generated by performing repetition on 54 bits after (256, 170) polar encoding is performed.

If a size of an encoded bit corresponds to 320, performance of a polar code generated by performing repetition or puncturing on N=256 or N=512 polar code is similar. Hence, a specific information bit size uses a different code length N depending on a code rate when polar encoding is performed.

According to a result shown in FIG. 21, in case of transmitting an encoded bit greater than 320 bits, since a coding gain is greater than a repetition gain, it is preferable to generate an encoded bit as much as a corresponding length by performing puncturing after encoding is performed using N=512 polar encoder. In case of transmitting an encoded bit less than 320 bits, it is preferable to generate an encoded bit as much as a corresponding length by performing repetition after encoding is performed using N=256 polar encoder. Hence, when an encoded bit length M corresponds to $2^x < M < 2^{x+1}$ (x is a natural number) for a specific information size, information on a code length of a polar code, which generates an encoded bit of M bits, should be known to both a transmitting end and a receiving end.

Method 1: It may consider a method of using a specific code rate ($r_c$) according to the x value. In this case, the $r_c$ may vary depending on the x value. The $r_c$ may correspond to a fixed value or a base station can transmit the $r_c$ to a UE via higher layer signaling.

(1) When $r < r_c$ and $2^x < M < 2^{x+1}$, M encoded bits are generated by performing puncturing after polar encoding of $2^{x+1}$ length is performed.

(2) When $r > r_c$ and $2^x < M < 2^{x+1}$, M encoded bits are generated by performing repetition after polar encoding of $2^x$ length is performed.

Method 2: The method 2 corresponds to a method of indicating a code length to be used for polar encoding of a control signal. In this case, since it is able to estimate the x value from an allocated resource and MCS information, it may be able to indicate $2^x$ or $2^{x+1}$ using 1 bit.

If the aforementioned polar coding scheme is applied to a wireless communication system, it may be able to considerably enhance communication performance.

The above-described embodiments correspond to combinations of elements and features of the present invention in prescribed forms. In addition, the respective elements or features may be considered selective unless explicitly mentioned otherwise. Each of the elements or features can be implemented in a form failing to be combined with other elements or features. Moreover, it is possible to implement an embodiment of the present invention by combining elements and/or features together in part. A sequence of operations explained for each embodiment of the present invention can be modified. Some configurations or features of one embodiment can be included in another embodiment or can be substituted for corresponding configurations or features of another embodiment. In addition, it is apparently understandable that an embodiment is configured by combining claims failing to have relation of explicit citation in the appended claims together or can be included as new claims by amendment after filing an application.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for performing polar encoding by a communication apparatus, the method comprising:
when a length of a codeword is greater than $2^x$ and smaller than $2^{x+1}$ and the length of the codeword is smaller than a prescribed threshold value, performing encoding by a polar encoder of size $2^x$; and
when the length of a codeword is greater than $2^x$ and smaller than $2^{x+1}$ and the length of the codeword is not smaller than the prescribed threshold value, performing encoding by a polar encoder of size $2^{x+1}$.

2. The method of claim 1, further comprising:
generating an encoded bit sequence of size N by performing repetition on N-$2^x$ bits when the length of the codeword corresponds to N.

3. The method of claim 1, further comprising:
generating an encoded bit sequence of size N by performing puncturing on $2^{x+1}$ -N bits when the length of the codeword corresponds to N.

4. The method of claim 1, further comprising:
performing interleaving encoded bits outputted from the polar encoder of the size of $2^x$ or the polar encoder of the size of $2^{x+1}$.

5. The method of claim 1, wherein the length of the codeword is a size of an encoded codeword for data payload including cyclic redundancy check (CRC) generated in a higher layer of the communication apparatus.

6. A communication apparatus performing polar encoding, the communication apparatus:
a polar encoder of size $2^x$ configured to perform encoding when a length of a codeword is greater than $2^x$ and smaller than $2^{x+1}$ and the length of the codeword is smaller than a prescribed threshold value; and
a polar encoder of size $2^{x+1}$ configured to perform encoding when the length of a codeword is greater than $2^x$ and smaller than $2^{x+1}$ and the length of the codeword is not smaller than the prescribed threshold value.

7. The communication apparatus of claim 6, wherein the polar encoder is configured to generate an encoded bit sequence of size N by performing repetition on N-$2^x$ bits when the length of the codeword corresponds to N.

8. The communication apparatus of claim 7, further comprising an interleaver configured to perform interleaving encoded bits outputted from the polar encoder of the size of $2^x$ or the polar encoder of the size of $2^{x+1}$.

9. The communication apparatus of claim 6, further comprising a processor configured to generate an encoded bit sequence of size N by performing puncturing on $2^{x+1}$ -N bits when the length of the codeword corresponds to N.

10. The communication apparatus of claim 6, wherein the length of the codeword is a size of an encoded codeword for data payload including cyclic redundancy check (CRC) generated in a higher layer of the communication apparatus.

* * * * *